United States Patent
Chiang et al.

(10) Patent No.: US 7,790,003 B2
(45) Date of Patent: Sep. 7, 2010

(54) METHOD FOR MAGNETRON SPUTTER DEPOSITION

(75) Inventors: Kuang-Tsan Kenneth Chiang, Helotes, TX (US); Ronghua Wei, San Antonio, TX (US); Edward Langa, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 742 days.

(21) Appl. No.: 11/397,878

(22) Filed: Apr. 4, 2006

(65) Prior Publication Data

US 2006/0251917 A1     Nov. 9, 2006

Related U.S. Application Data

(63) Continuation-in-part of application No. 10/963,341, filed on Oct. 12, 2004, now Pat. No. 7,520,965, and a continuation-in-part of application No. 10/962,772, filed on Oct. 12, 2004, now abandoned.

(51) Int. Cl.
*C23C 14/35* (2006.01)
(52) U.S. Cl. .............. 204/192.15; 204/192.12; 204/192.16
(58) Field of Classification Search ............ 204/192.12, 204/192.15, 192.16
See application file for complete search history.

(56) References Cited

U.S. PATENT DOCUMENTS

| | | | |
|---|---|---|---|
| 3,756,939 A * | 9/1973 | Hurwitt | ............ 204/298.12 |
| 4,009,090 A | 2/1977 | Veigel | |
| 4,124,737 A | 11/1978 | Wolfa et al. | |
| 4,179,351 A | 12/1979 | Hawton et al. | |
| 4,221,652 A | 9/1980 | Kuriyama | |
| 4,376,025 A | 3/1983 | Zega | |
| 4,407,713 A * | 10/1983 | Zega | ............ 204/298.22 |
| 4,444,643 A | 4/1984 | Garrett | |
| 4,478,703 A | 10/1984 | Edamura | |
| 4,525,264 A | 6/1985 | Hoffman | |

(Continued)

FOREIGN PATENT DOCUMENTS

GB     2125441     3/1984

(Continued)

OTHER PUBLICATIONS

Musil et al. "Nanocrystlline and nanocomposite CrCu and CrCu-N films prepared by magnetron sputtering", Surface and Coatings Technology vol. 115, Jun. 1999, pp. 32-37.*

(Continued)

*Primary Examiner*—Rodney G McDonald
(74) *Attorney, Agent, or Firm*—Grossman Tucker et al.

(57) ABSTRACT

A method for depositing a nanostructured coating comprising chromium or a copper-chromium mixture on a workpiece. The workpiece may comprise a hollowed structure such as a rocket or jet engine combustion chamber liner. The method comprises providing a magnetron and an external sputter target material comprising chromium or a copper-chromium composite and effecting a magnetron sputter deposition to deposit a substantially uniform nanostructured coating comprising said sputter target material on said workpiece. The method may include plasma enhancement wherein a filament is utilized to produce a plasma that effects an ion bombardment on the workpiece during the magnetron sputter deposition process. The invention also includes the nanostructured coatings deposited by these methods and workpieces coated thereby.

36 Claims, 22 Drawing Sheets

U.S. PATENT DOCUMENTS

| | | | |
|---|---|---|---|
| 4,818,359 A | | 4/1989 | Jones et al. |
| 4,885,216 A | * | 12/1989 | Naik .................. 428/680 |
| 4,960,753 A | | 10/1990 | Collins et al. |
| 4,971,674 A | * | 11/1990 | Hata ................ 204/192.2 |
| 5,015,493 A | | 5/1991 | Gruen |
| 5,096,562 A | | 3/1992 | Boozenny et al. |
| 5,272,735 A | | 12/1993 | Bryan et al. |
| 5,346,600 A | * | 9/1994 | Nieh et al. ........... 204/192.3 |
| 5,391,407 A | | 2/1995 | Dearnaley |
| 5,393,572 A | | 2/1995 | Dearnaley |
| 5,445,721 A | | 8/1995 | Bower |
| 5,501,745 A | | 3/1996 | Dearnaley |
| 5,556,713 A | | 9/1996 | Leverant |
| 5,557,927 A | * | 9/1996 | Chiang et al. ............ 60/257 |
| 5,580,669 A | | 12/1996 | Beers et al. |
| 5,698,273 A | | 12/1997 | Azad et al. |
| 5,750,185 A | | 5/1998 | Goedicke et al. |
| 5,792,521 A | | 8/1998 | Wortman |
| 5,919,561 A | | 7/1999 | Fuchs et al. |
| 5,935,391 A | | 8/1999 | Nakahigashi et al. |
| 5,981,088 A | | 11/1999 | Bruce et al. |
| 5,997,957 A | | 12/1999 | Bertamini et al. |
| 6,040,067 A | | 3/2000 | Sugawara et al. |
| 6,060,175 A | | 5/2000 | Swisher |
| 6,063,435 A | | 5/2000 | Schulz et al. |
| 6,153,313 A | | 11/2000 | Rigney et al. |
| 6,200,649 B1 | | 3/2001 | Dearnaley |
| 6,277,499 B1 | | 8/2001 | Beers et al. |
| 6,291,084 B1 | | 9/2001 | Darolia et al. |
| 6,314,720 B1 | | 11/2001 | Holmes et al. |
| 6,338,777 B1 | | 1/2002 | Longstreth White |
| 6,352,788 B1 | | 3/2002 | Bruce |
| 6,365,010 B1 | | 4/2002 | Hollars |
| 6,562,417 B2 | | 5/2003 | Suzuki et al. |
| 6,620,465 B2 | | 9/2003 | Rigney et al. |
| 6,767,436 B2 | | 7/2004 | Wei |
| 6,838,191 B1 | | 1/2005 | Raj |
| 6,905,579 B2 | | 6/2005 | Crowley |
| 2002/0122895 A1 | | 9/2002 | Cheong et al. |
| 2004/0151845 A1 | | 8/2004 | Nguyen et al. |
| 2004/0191436 A1 | | 9/2004 | Wei et al. |
| 2004/0258851 A1 | | 12/2004 | Selvamanick |
| 2005/0145488 A1 | | 7/2005 | Erbkamm et al. |
| 2005/0178662 A1 | | 8/2005 | Wurczinger |
| 2005/0224343 A1 | | 10/2005 | Newcomb et al. |

FOREIGN PATENT DOCUMENTS

| | | |
|---|---|---|
| JP | 59215484 | 12/1984 |
| JP | 04107268 | 4/1992 |
| JP | 05-230648 | 9/1993 |
| WO | 9917307 | 4/1999 |

OTHER PUBLICATIONS

Seok et al. "Sputter-deposited nanocrystalline Cr and CrN coatings on steels", Surface and Coating Technology, vol. 138, Apr. 2001, pp. 14-22.*

Baker et al. "Investigation of the nanostructure and wear properties of physical vapor deposited CrCuN nanocomposite coatings", J. Vac. Sci. Tech. A 23(3), May/Jun. 2005, pp. 423-433.*

Chiang et al., "Blanching Resistant Cu-Cr Coating by Vacuum Plasma Spray", 76-77 Surface Coatings Tech. (1995), pp. 14-19.

Chiang et al., "Oxidation Studies of Cu-Cr Coated Cu-Nb Microcomposite", 61 Surface and Coatings Tech. (1993), pp. 20-24.

Chiang et al., "Oxidation Kinetics of Cu-30vol.%Cr Coating", 78 Surface and Coatings Tech. (1996), pp. 243-247.

Thomas-Ogbuji, "Protection of Advanced Copper Alloys with Lean Cu-Cr Coatings," NASA Technical Reports Server, gltrs.grc.nasa.gov/reports/2003/CR-2003-212548.pdf; published Aug. 2003, p. 1-14.

United States Office Action issued in related U.S. Appl. No. 11/054,665 dated Nov. 3, 2008.

United States Office Action issued in related U.S. Appl. No. 11/054,665 dated Mar. 31, 2008.

United States Office Action issued in related U.S. Appl. No. 11/054,665 dated Sep. 24, 2007.

United States Office Action issued in related U.S. Appl. No. 11/054,665 dated Mar. 14, 2007.

United States Office Action issued in related U.S. Appl. No. 10/962,772 dated Apr. 8, 2008.

United States Office Action issued in related U.S. Appl. No. 10/963,341 dated Jun. 4, 2008.

United States Notice of Allowance issued in related U.S. Appl. No. 10/963,341 dated Feb. 23, 2009.

United States Office Action issued in related U.S. Appl. No. 10/963,341 dated Jan. 31, 2008.

United States Office Action issued in related U.S. Appl. No. 10/963,341 dated Nov. 2, 2007.

United States Office Action issued in related U.S. Appl. No. 10/963,341 dated Jul. 6, 2007.

United States Office Action issued in related U.S. Appl. No. 10/963,341 dated Feb. 5, 2007.

United States Office Action issued in related U.S. Appl. No. 10/963,341 dated Nov. 20, 2006.

United States Office Action issued in related U.S. Appl. No. 10/963,341 dated Jul. 21, 2006.

Singh et al., "An Overview: Electron Beam-Physical Vapor Deposition Technology—Present and Future Applications," Surface Engineering Science and Technology I, 1999, pp. 59-74.

Fu, et al., "Microstructural effects on the high temperature oxidation of two-phase Cu-Cr alloys in 1 atm O2," Corrosion Science 45 (2003) 559-574.

Ellis, et al., "Mechanical and Thermal Properties of Two Cu-Cr-Nb Alloys and NARloy-Z", NASA CR-198529 (Oct. 1996).

Chiang, "Microstructure Analysis of Cu-Cr Coatings After High Temperature Oxidation", CNWRA:San Antonio, TX (2003).

Pyburn, et al, "Dwell Sensitivity Behavior of High Temperature Materials", Dept. of Mech. Eng., Arkansas Tech. Univ.

Prabhu, "Intelligent Automation. of Electron, Beam Physical Vapor. Deposition EB Using LabVIEW", National Instruments. Customer. Solutions, publication (2000).

Arps,. "Ion Surface Engineering",www.swri.org/3pubs/brochure/d06/ionbeam/EB_ionbeam.htm (Jan. 11, 2005).

Ellis, et al., "GRCop-84 Developed. for. Rocket Engines", www. IBrc.nasa.gov/ EBWWW/RT2000/5000/51_OOE-ellis.html (Jan. 17, 2005).

International Search Report and Written Opinion issued in related International Patent Application No. PCT/US2005/24110 dated Jan. 31, 2006.

Hosokawa et al, Selt-Sputtertng phenomena in high-ratte coaxial cylindrical magnetron sputtering. J. Vac. Sci. Technol., Jan./Feb. 1977, 143-146, 14(1). American Vacuum Society.

Malik et al., "Development of an energetic ion assisted mixing and deposition process for TiNx and diamondlike carbon films, using a coaxial geometry in plasma source ion implantation," J. Vac. Sci. Tech. Nov./Dec. 1997, 2875-2879.

Ensinger, "An apparatus for sputter coating the inner walls of tubes," Rev. Sci. Instrum., Jan. 1996, 318-321, 67 (1), American Institute of Physics.

* cited by examiner

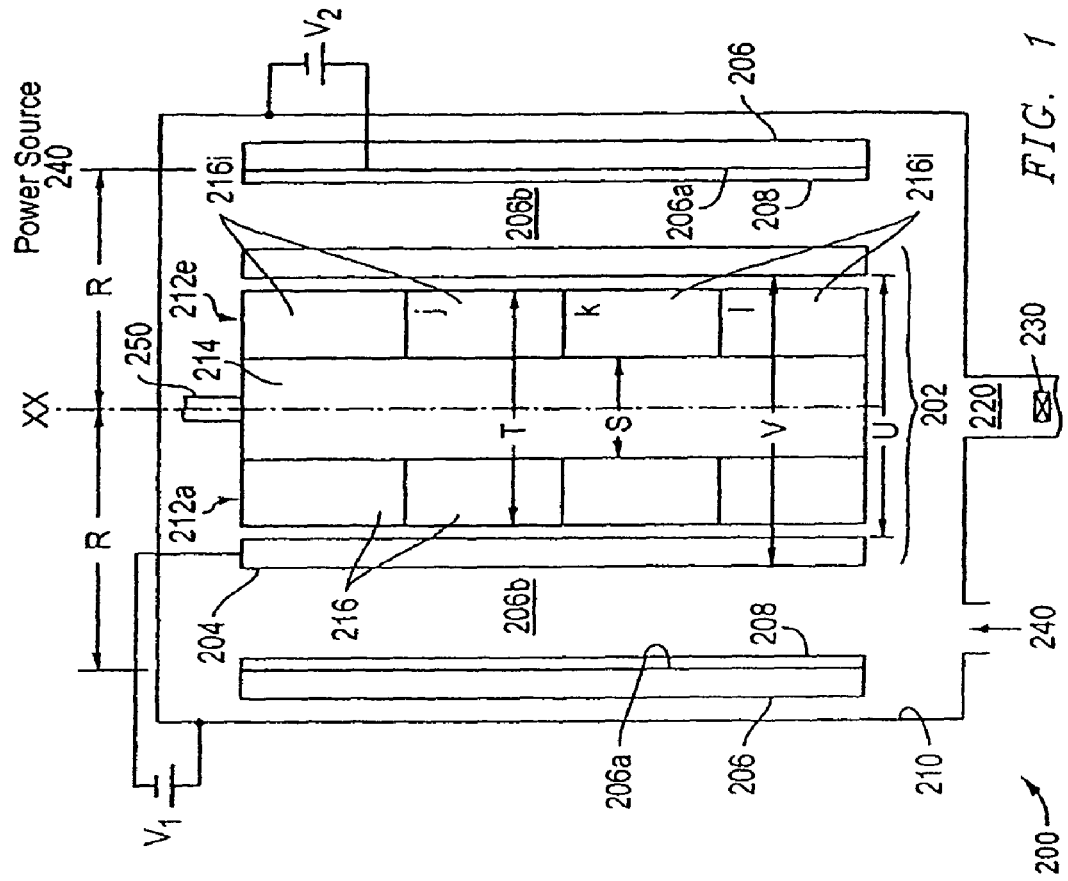
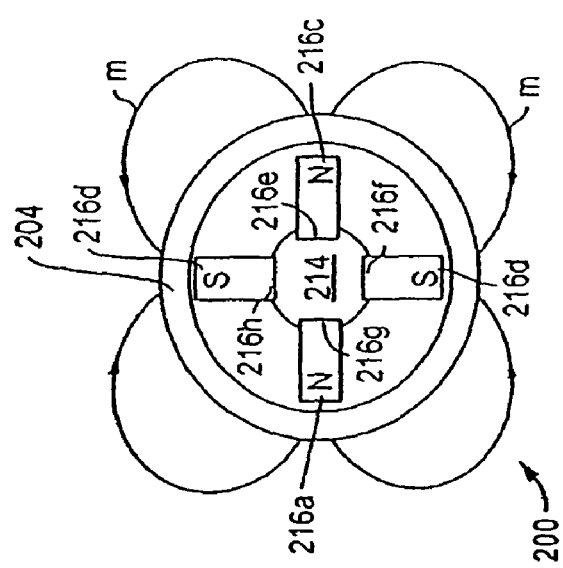

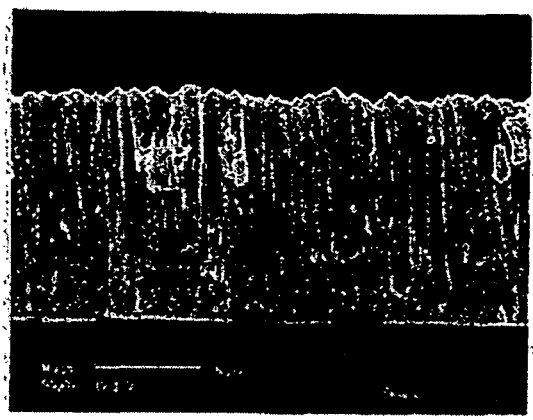
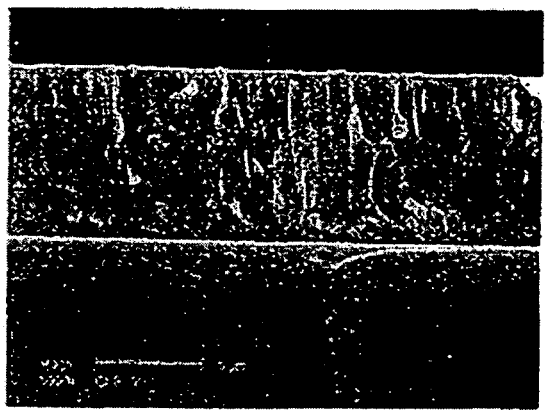
Fig. 12A  Fig. 12B
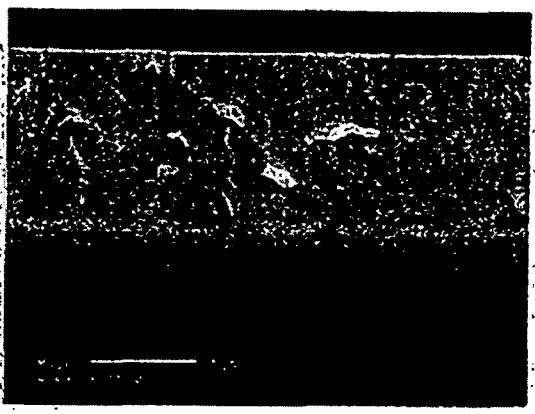
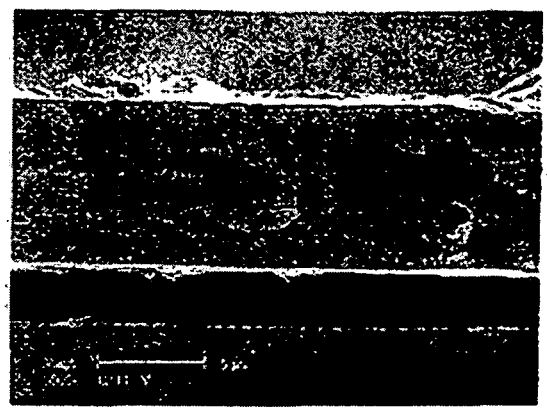
Fig. 12C  Fig. 12D

METHOD FOR MAGNETRON SPUTTER DEPOSITION

CROSS-REFERENCE TO RELATED APPLICATIONS

This application is a continuation-in-part application claiming the benefit of pending U.S. patent application Ser. No. 10/963,341, (filed Oct. 12, 2004), entitled "System and Apparatus for Magnetron Sputter Deposition," and pending U.S. patent application Ser. No. 10/962,772, (filed Oct. 12, 2004), entitled "Method for Magnetron Sputter Deposition." The present application is also related to U.S. patent application Ser. No. 11/054,665, (filed Feb. 9, 2005), entitled "Nanostructured Low-Cr Cu—Cr Coatings for High Temperature Oxidation Resistance." These applications are hereby incorporated by reference in their entireties.

FIELD OF THE APPLICATION

The present application relates generally to a method of depositing a nano-structured coating on a workpiece using a magnetron sputter deposition process.

BACKGROUND

Tubular workpieces, such as gun barrels and engine cylinders, often require hard, wear-resistant, and/or corrosion resistant interior coatings. Although methods exist for depositing protective coatings on planar surfaces, these line-of-sight process are ineffective in providing a coating for a tubular workpiece. A number of techniques have been used to coat interior tubular surfaces, including magnetron sputtering. Unfortunately, the magnetron sputtering systems used to form such coatings generally have been inefficient and/or ineffective. More efficient and effective methods for applying such coatings are needed.

BRIEF SUMMARY OF THE INVENTION

The present invention provides a method for depositing a nanostructured coating comprising chromium or a copper-chromium mixture on an interior surface of a hollowed workpiece. The method comprises providing a hollowed copper-containing workpiece comprising an interior surface to be coated and a hollow having a longitudinal axis; providing a sputter target material comprising one or more metals having a longitudinal bore substantially coextensive with said longitudinal axis; positioning the workpiece, sputter target material, and a magnet assembly in a vacuum chamber, whereby the sputter target material is disposed substantially within the workpiece and the magnet assembly is disposed substantially within the sputter target material; providing to the vacuum chamber a gas suitable for forming plasma; reducing the pressure of the vacuum chamber; rotating the magnet assembly relative to the sputter target material; and generating a circumferentially directed magnetic field with the magnet assembly proximate the sputter target material, thereby ionizing the gas to produce plasma thereof, whereby bombardment of the sputter target material by the plasma causes particles of the sputter target material to be directed toward and deposited on the interior surface, thereby forming a nanostructured coating comprising particles of the one or more metals thereupon. Optionally, a filament is utilized to produce an additional plasma useful in depositing the nanostructured coating. In an embodiment, the filament is employed in a planar sputter deposition system. The present invention also encompasses various coatings produced by the above described method and workpieces containing these coatings.

BRIEF DESCRIPTION OF THE FIGURES

Exemplary systems, apparatus, and methods will now be described with reference to the accompanying simplified, diagrammatic, not-to-scale drawings. In the drawings:

FIG. 1 is a simplified, longitudinal cross-sectional view of a magnetron sputtering system, according to the present application;

FIG. 1A is an end view of the magnetron sputtering system in FIG. 1;

FIGS. 12A-D show scanning electron microscopy cross-sectional images of Cr coatings deposited on samples disposed in a vertical orientation according to the present invention utilizing various levels of plasma enhancement;

DETAILED DESCRIPTION OF THE INVENTION

Figure 2:
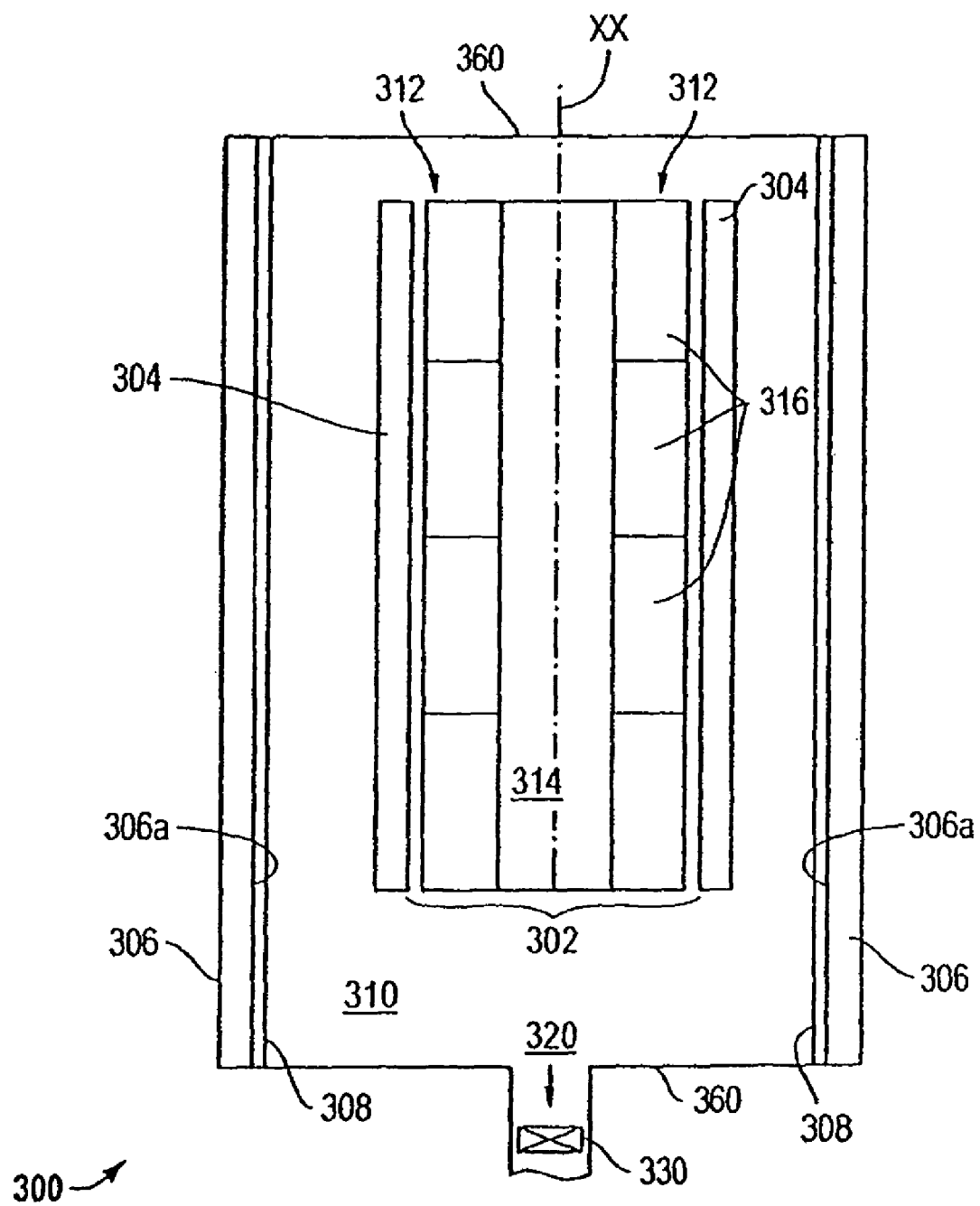
FIG. 2 is a simplified, longitudinal cross-sectional view of an alternative magnetron sputtering system, according to the present application.

The present application provides a system, apparatus, and method of depositing a coating on an interior surface of a substrate or workpiece utilizing a magnetron sputtering process. The method of deposition is implemented through operation of a magnetron sputtering system or assembly that includes a magnetron sputtering apparatus ("magnetron") and the workpiece. The magnetron comprises a sputter target material, from which sputter material is ejected and directed to the workpiece surface to be coated.

The workpiece is positioned in the vicinity of the magnetron and preferably, such that the interior surface to be coated is facing the sputter target material. The system, apparatus, and method herein are particularly suited for depositing a coating on a hollowed workpiece. Suitable workpieces comprise a hollow or space defined by an interior wall in which the magnetron is positioned. More preferably, the hollowed workpiece comprises a tubular structure having an elongated bore defined substantially by the interior surface to be coated and within which the magnetron is positioned during the deposition process. Examples of such workpieces include, but are not necessarily limited to gun barrels, engine cylinders, piping components, and other tubular structures.

FIGS. 1-21 depict exemplary magnetron sputtering systems ("magnetron") and/or apparatus according to the present application. FIGS. 1-21 are exemplary only, and should not be interpreted as limiting the application to the systems, apparatus, and methods specifically illustrated in these Figures and/or described in the corresponding description.

The term "magnetron sputtering system" or "magnetron" refers to the system or assembly that includes the workpiece and other components or equipment used to implement the magnetron sputtering process. In its basic form, the magnetron comprises a magnet assembly and support for the magnet assembly. The magnetron also preferably comprises the sputter target material and negative biasing apparatus for negatively biasing the sputter target material.

Referring to FIG. 1, a magnetron sputtering system 200 includes a magnetron sputtering apparatus or magnetron 202, a hollowed workpiece 206, and a vacuum chamber 210 housing both components. The hollowed workpiece 206 has an interior surface 206a on which a coating 208 is deposited and a cylindrical bore 206b having a radius, R, and a longitudinal axis, XX. The magnetron 202 includes a sputter target material 204, a magnet assembly 212 spaced radially inward of the target material 204, and a support structure 214, preferably a ferromagnetic support structure 214, about which magnets 216 are supported.

The magnetron 202 preferably is centrally positioned about the longitudinal axis XX of the bore 206b and extends substantially in excess of or about the length of the workpiece 206. As shown in FIG. 1, the interior surface 206a is spaced radially outward from the sputter target material 204. Thus, the magnetron 202 is disposed substantially within the bore 206b of the workpiece 206. Preferably, the magnetron 202 is positioned substantially radially equidistant from the interior surface 206a of the workpiece along the longitudinal axis of the interior surface 206a. "Substantially radially equidistant" includes a variation of about less than 10% of the diameter V of the sputter target material 204. In a preferred embodiment, the variation is less than 1% of the diameter V of the sputter target material 204.

The sputter target material 204 may be substantially any material which may be sputter deposited onto the interior surface 206a. The sputter target material 204 preferably is an elongated cylinder which, when centrally positioned within the hollowed workpiece 206, also has longitudinal axis XX. The following are substantially coaxial and located radially outward relative to one another: the external diameter of the support 214 (S); the external diameter of the magnet assembly (T); the internal diameter of the sputter target material 204

(U); the external diameter of the sputter target material (V); and the internal diameter of the interior surface 206a (R).

The support 214 may be made of a variety of materials effective to support the magnets without interfering with the coating process. The support 214 preferably comprises ferromagnetic material, most preferably iron or carbon steel. The cross-section of the support 214 may be rounded, rectangular, or any other shape suitable to support the magnet assembly 212 having a diameter sufficiently small to permit the support to be centrally positioned within the longitudinal bore of the sputter target material 204. In one embodiment, discussed below, the support structure 214 has or incorporates an elongated bore or a hollowed shaft that serves as a conduit and a rotatable drive shaft.

The magnetron sputtering system 200 comprises a vacuum chamber port 220 and a pump 230 in fluid communication with the vacuum chamber 210. The vacuum chamber 210 includes a gas feed 240 for providing a suitable gas for plasma generation. Suitable gases include inert gases, which include, but are not necessarily limited to argon, krypton, xenon, and combinations thereof. A preferred inert gas is argon. Where the coating is a ceramic coating, one or more reactive gas also is provided. Suitable reactive gases comprise an element selected from the group consisting of nitrogen and carbon in a form which reacts with ceramic precursor material to produce a ceramic coating. Examples of suitable reactive gases include, but are not necessarily limited to gaseous nitrogen, methane, acetylene, oxygen, ammonia, and combinations thereof.

The magnetron sputtering system 200 also preferably provides an energy source for negatively biasing the sputter target material 204 and an energy source for negatively biasing the inside surface 206a of the workpiece 206. In a preferred embodiment, the energy sources are voltage sources V1 and V2, respectively and associated circuitry.

A rotatable drive mechanism (partially represented and denoted by numeral 250 in FIG. 1) is another preferred component of the magnetron sputtering system 202. The rotatable drive mechanism 250 may be in the form of an assembly including a motor, drive shaft, and a coupling connection with the support structure 214. The rotatable drive mechanism 250 may further include a programmable logic controller or equivalent controller means for controlling rotation of the magnet assembly 212 during the magnetron sputtering operation. The rotatable drive mechanism 202 is operated to rotate the magnet assembly 212 relative to the sputter target material 204, thereby enhancing the deposition process, promoting a more uniform coating on the interior surface 206a, and increasing the utilization of the sputter target material.

The magnet assembly 212 preferably comprises elongated magnets 216 mounted along the support 214 having a central axis XX. More preferably, the magnets 216 are rectangular or bar magnets 216 circumferentially spaced apart from one another about the support 214, as shown in FIG. 1A. The phrase "circumferentially spaced apart" means that the magnets 216 are positioned at spaced intervals about the perimeter ("circumference") of the support 214. Such an arrangement does not require the support structure 214 to have a specific shape or cross section. The support structure 214 may have a circular, elliptical, rectangular, or any other number of suitable cross sections. Further, the magnets 216 may be arranged in a circular or non-circular pattern.

Referring specifically to FIG. 1A, the magnets 216 have an internal surface or pole 216e, 216f, 216g, and 216h in contact with the support structure 214 and an opposed, external surface or pole 216a, 216b, 216c, 216d positioned radially outward of the support structure 214. The internal and external surfaces, respectively, have opposite North or South polarities and the magnetic field within the magnets may be directed radially inward or outward depending on the polarity orientations. In FIG. 1A, the magnets 216 are illustrated with an indication of the polarity at the external surfaces 216a, 216b, 216c, 216d. As best shown in the end view of FIG. 1A, an even number of bar magnets are circumferentially spaced apart on the support 214. Preferably, four bar magnets 216 are circumferentially spaced apart by about 90°. The magnets 216 are further arranged about the structural support 214 such that the exposed surfaces of circumferentially adjacent magnets (e.g., 216a and 216b) have opposite polarity orientations. It should be understood that other even numbers of rows (e.g., 2, 6, 8, 10, etc.) may also be used depending on the size of the magnetron.

Referring back to FIG. 1, each row of magnets 216a-216d is preferably divided into segments 216i, 216j, 216k, and 216(1). The segments 216i, 216j, 216k, and 216(1) of each row are mounted so that all of the segments of the same row have the same polarity orientation. For example, FIG. 1 illustrates two rows of magnets 216a and 216c spaced at substantially 180°. Each segment 216i, 216j, 216k, 216(1) in a row 216a, 216b, respectively, has the same North-South polarity orientation.

The magnets generate a circumferential magnetic field, or a magnetic field directed from one row of magnets to successive rows of magnets about the perimeter of the cylindrical sputter target material 204. Preferably, the magnets generate a "circumferential external magnetic field" M having a magnetic field orientation which travels circumferentially from one circumferentially spaced magnet 216a to the next successive circumferentially spaced magnet 216b outside of the external diameter V of the cylindrical sputter target material 204. This contrasts with the typical magnetic field, which travels along the longitudinal axis XX of the magnetron sputtering system 200. The magnets generally produce a magnetic field of about 500 Gauss or more, preferably about 1000 Gauss or more.

Because of the geometric characteristics of the magnet assembly 212, the ion current density generated is relatively uniform along the length and circumference of the sputter target material 204. The ion current density generally is from about 0.01 mA/cm$^2$ to about 500 mA/cm$^2$, preferably about 20 mA/cm$^2$. In a preferred embodiment, circumferential uniformity is further promoted by rotating the sputter target material 204 relative to the workpiece 206. Rotation at optimal speed may be accomplished by operation of the rotatable drive mechanism 250.

The rate of decay of the sputter material and the deposited coating 208 are also substantially uniform, even when the sputter target material 204 and workpiece 206 are positioned in close proximity. Preferably, greater than 50 wt. % of the target material is used, more preferably 70 wt. % or more, even more preferably 80 wt. % or more, even more preferably 90 wt. % or more, and most preferably 95 wt. % or more of the target is utilized. This is, in itself, a design advantage provided by the magnetron sputtering system according to the present application, which is further exemplified in the design variations of FIGS. 2-5.

The magnetron sputter assembly in each of FIGS. 1-5 is useful to deposit substantially any coating material amenable to sputter deposition. The sputter target material 204 may be selected on the basis of application requirements, including but not necessarily limited to wear resistance, corrosion resistance, high temperature erosion resistance, and combinations thereof. Examples of coatings that may be deposited using the magnetron include, but are not necessarily limited to metallic coatings and ceramic coatings. Suitable metallic coatings include, but are not necessarily limited to coatings comprising a metal selected from the group consisting of tantalum, titanium, aluminum, iron, copper, chromium, platinum, palladium, tungsten, and combinations thereof. Suitable ceramic coatings include, but are not necessarily limited to titanium nitride, chromium carbide, aluminum oxide, titanium carbonitride, chromium nitride, aluminum nitride, tungsten nitride, and tungsten carbide.

Once the sputter target material 204 and magnetron 202 are centrally positioned within the workpiece 206, the magnetic sputter assembly is exposed to sputter deposition conditions effective to produce a substantially uniform coating. The sputter deposition conditions will vary with the particular coating. Preferably, the vacuum is pumped down to a base pressure of $10^{-6}$ to $10^{-5}$ Torr. Preferably, the interior surface of the workpiece 206a is first cleaned to remove superficial contaminants. An inert gas, such as argon gas, is backfilled into the chamber to a pressure sufficiently high to cause the magnetron to function stably as to sputter target material to deposit onto the workpiece. Suitable pressures generally are from about $10^{-4}$ to about $10^{-1}$ torr, preferably from about 0.1 to about 50 millitorr, most preferably 5 millitorr.

In a preferred embodiment, the magnet assembly 212 is biased with RF (radio frequency), DC, or pulsed DC, and the workpiece 206 is biased with DC or pulsed DC. Depending on the applied power to the magnetron and the bias voltage to the tube, coatings may be formed at temperatures as low as about 100° C., or as high as about 500° C. The biasing conditions, and the sputter deposition conditions, are maintained for a duration necessary to deposit a coating having a desired thickness. Generally, the thickness is from about 0.1 μm to about 200 μm. The time required to sputter deposit the desired thickness generally is from about 10 minutes to about 300 minutes, most preferably for about 120 minutes.

When the magnetron is biased with RF, the magnetron biasing conditions comprise RF having a frequency of about 100 kHz to about 15 MHz, preferably about 13.56 MHz, at a power of from about 0 kW to about 10 kW, preferably about 1 kW, depending on the size of the magnetron.

When bias is DC or pulsed DC, the magnet assembly and/or the workpiece biasing conditions comprise a pulse frequency of from about 100 Hz to about 3 kHz, preferably from about 1 kHz to about 2 kHz, a pulse width of from about 5 microseconds to about 300 microseconds, preferably about 20 microseconds. The magnetron biasing conditions comprise DC voltage of about 1000 V or less and pulsed DC voltage of about 100 V to about 1200V and a power of from about 100 W to about 10 kW depending on the size of the magnetron. In a preferred embodiment, the magnetron biasing conditions comprise a power of about 1 kW, preferably for a magnetron having a diameter of about 2" and a length of about 24". The workpiece biasing conditions are substantially the same as the magnetron biasing conditions with the exception of reduced voltage and consequently reduced power. The workpiece biasing conditions generally comprise about 1000 V or less, preferably from about 0 to about 500 V, more preferably abut 250 V, most preferably about 50 V.

Where the coating is a metallic coating, a sputter target material 204 comprising one or more selected metal is mounted on supports about the magnet assembly 212. Before initiating the actual sputtering of the target material, the pump 230 is operated to evacuate the vacuum chamber 210 to a pressure of about $10^{-6}$ to $10^{-5}$ torr. A suitable gas is introduced into the vacuum chamber 210. For deposition of a metallic coating, suitable gases are inert gases, which include, but are not necessarily limited to argon, krypton, xenon, and combinations thereof. This gas is fed into the chamber 210 under sputter deposition conditions effective to produce a substantially uniform coating of the particular metal. In a preferred embodiment, the gas is substantially continuously fed into the chamber through the duration of the process.

The magnetron 202 is biased, preferably negatively biased. The magnetron may be biased with radio frequency (RF) or negative voltage in the form of DC power or pulse DC power. Where DC power or pulse DC power is used, voltage control V1 is activated to negatively bias the magnet assembly 212 and voltage control V2 is activated to ground or negatively bias the workpiece 206.

Positive ions from the plasma are accelerated toward the negatively charged sputter target material 204 with sufficient energy to remove or sputter target particles from the sputter target material 204. Electrons freed during the ion bombardment process are confined by the magnetic field, M, generated around the sputter target material 204 and contribute to further ionization. In the meantime, the sputtered particles and are deposited onto the interior surface of the workpiece 206 to form a substantially uniform metallic coating 208 having a desired thickness. As used herein, a "substantially uniform coating" refers to the interior surface being completely covered by a coating having a desired thickness, preferably, a coating having a uniformity of thickness of about +/−20% or less of the desired coating thickness along its length.

In another embodiment, a ceramic coating is deposited onto the interior surface of the tubular workpiece. A suitable target material 204 is first selected depending on the type of ceramic coating to be formed, the characteristics of the workpiece 206, and the desired characteristics of the coating itself. The sputter target material generally comprises silicon or the metal component of the ceramic. Preferred sputter target materials include, but are not necessarily limited to titanium, chromium, aluminum, silicon, tungsten, molybdenum, boron, and combinations thereof. The vacuum chamber 210 is pumped down to about $10^{-6}$ to $10^{-5}$ torr. Then, a reactive gas effective to form the desired ceramic is fed to the chamber. Suitable reactive gases for the formation of ceramic coatings include, but are not necessarily limited to nitrogen, methane, acetylene, oxygen, ammonia, and combinations thereof. In a preferred embodiment, the reactive gas further comprises an inert gas, preferably argon. The assembly is subjected to sputter deposition conditions effective to produce a substantially uniform ceramic coating.

For example, where the ceramic coating is TiN, titanium is chosen as the sputter target material. After adjusting the pressure in the chamber, a combination of argon and nitrogen at a ratio of about 80 vol. % to 20 vol. % is fed to the chamber at a rate of about 200 standard cubic centimeters per minutes (SCCM). The biasing mechanism is activated to negatively bias the magnet assembly 212, and to either ground or negatively bias the workpiece 206. The magnetron 202 is activated, and titanium atoms are sputtered from the titanium sputter target material and deposited onto the interior surface 206a of the workpiece 206. The chamber conditions are effective to induce the reactive gas (nitrogen) to react with the metal (Ti) to form the desired coating (e.g., N reacts with Ti to form TiN). For TiN, the conditions include a temperature of about 400° C. The process is continued for a period sufficient to form a substantially uniform coating of TiN having a thickness of from about 0.5 micrometers to about 3 micrometers. This generally requires a time period of about 3 hours. Upon completion, the coated workpiece 206 is removed from the vacuum chamber 210.

In another embodiment, a ceramic coating is deposited onto the interior surface of the hollowed workpiece, preferably a tubular workpiece, via sputtering a ceramic target. Substantially any ceramic target may be used as long as it is amenable to sputtering. Preferred ceramic targets for this embodiment include, but are not necessarily limited to titanium boride and tungsten carbide.

FIG. 2 illustrates a variation of the magnetron sputtering system 300 of FIG. 1. Specifically, FIG. 2 depicts a magnetron sputtering system 300 wherein the workpiece 306 provides, at least partially, the walls of the vacuum chamber 308. In this magnetron sputtering system 300, the ends of the hollowed workpiece 306 are sealed, via a cap, plate or equivalent sealing means, so as to complete the vacuum chamber 310. The magnetron 302, including magnets 316 and cylindrical sputter target material 304, are centrally situated within the vacuum chamber 310.

As with the magnetron sputtering system 200 of FIG. 2, the vacuum chamber 310, or more specifically, one of the sealed ends 360, is provided with a port 320 in fluid communication with a pump 330. The magnetron sputtering system 300 also comprises appropriate power supplies, gas feeds, and other components. See, e.g., U.S. Pat. No. 6,767,436, incorporated herein by reference.

The magnet assembly 312 comprises magnets 316 in an arrangement effective to generate a circumferential magnetic field about the sputter target material 304. The circumferential magnetic field preferably is effective to produce a substantially uniform sputter deposited coating and to use greater than 50 wt. %, preferably 70 wt. % or more, more preferably 80 wt. % or more, even more preferably 90 wt. % or more, most preferably 95 wt. % or more of the sputter target material 304. It is not necessary to widen the space between the sputter target material 304 and the interior surface 306a of the workpiece 306 in order to achieve uniform deposition of coating on the interior surface of the workpiece. Accordingly, a uniform coating is formed even on workpieces having relatively small bores, preferably as small as 2 inches or less, more preferably as small as 1 inch or less.

Figure 3:
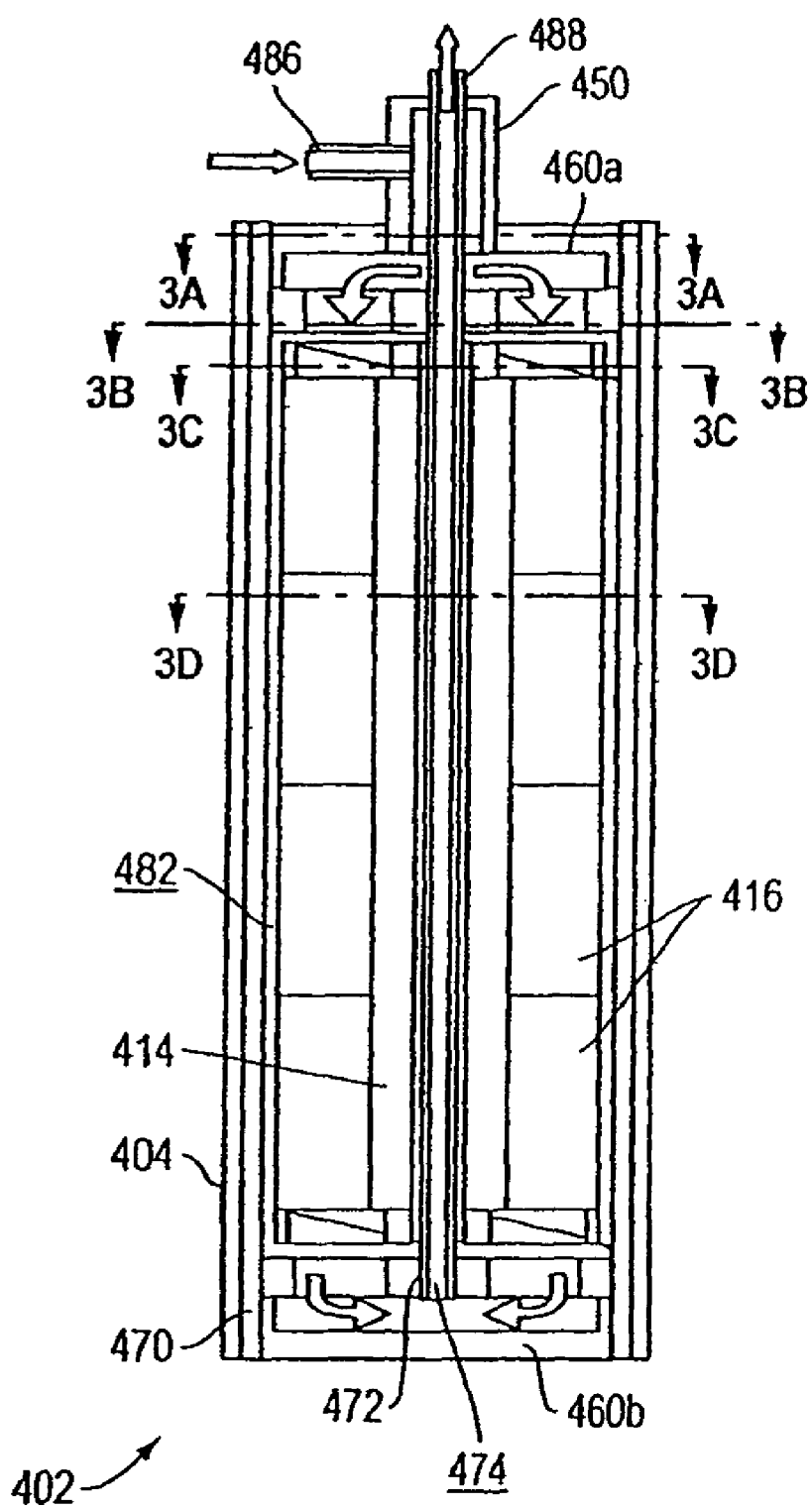
FIG. 3 is a simplified, longitudinal cross-sectional view of an alternative magnetron sputtering apparatus, according to the present application.

FIG. 3 depicts another variation of the magnetrons 202, 302 of FIGS. 1 and 2, respectively. In this embodiment, the magnetron 402 includes sealed end caps 460a, 460b that enclose the magnetron 402 and, as further described below, enclose a cooling system.

The magnetron 402 is centrally situated within the bore of the workpiece (not shown). As with the magnetrons of FIGS. 1 and 2, the magnetron 402 includes a magnet assembly 412 of segmented bar magnets 416 supported about an elongated support structure 414. The magnet assembly 412 is arranged to generate a circumferentially directed magnetic field about the sputter target material 404. The support structure 414 is amended, in this design variation, by provision of an inner shaft or support tube 472. The support tube 472 defines a central longitudinal conduit 474 that extends from one end of the magnetron 402 to the opposite end.

Figure 3A:
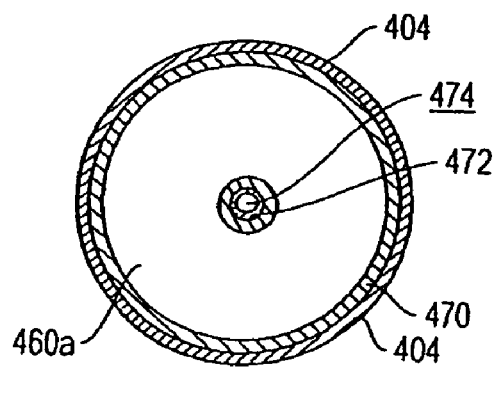
FIG. 3A is a cross-sectional view from line 3A-3A through the magnetron sputtering apparatus in FIG. 3.

As best shown in the cross-sectional view of FIG. 3A, the cylindrical sputter target material 404 is mounted about an outer support tube 470. The support tube 470 is spaced radially outward of the magnets 416, thereby providing a circumferential gap 482 there between. The ends of the support tube 470 are sealingly engaged by end plugs 460a, 460b to enclose the magnets 416 therebetween and to form a sealed interior and cooling system.

The magnetron 402 of FIG. 3 comprises an integrated coolant system with a plurality of coolant passages passing adjacent to the magnet assembly 412. The central conduit 474 provides one coolant passage. In particular, the central conduit 474 provides a return, hot coolant passage. Referring to FIG. 3B, a coolant distributor plate 476 is mounted about the inner tube 472 just across each end cap 460a, 460b. The distributor plates 476 include a plurality of ports 478 that are aligned with the channel space between the magnets 416 (see e.g., FIG. 3D). The distributor plates 476 further include a port for the central conduit 474.

Figure 3C:
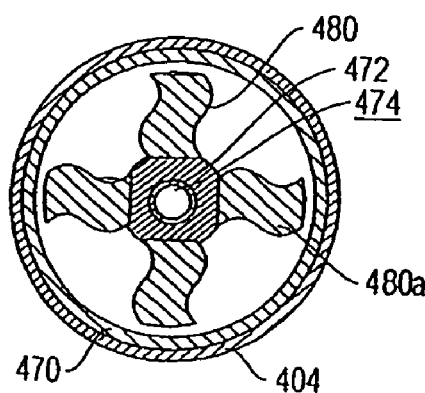
FIG. 3C is a lateral cross-sectional view from line 3C-3C through the magnetron sputtering apparatus in FIG. 3.
Figure 3B:
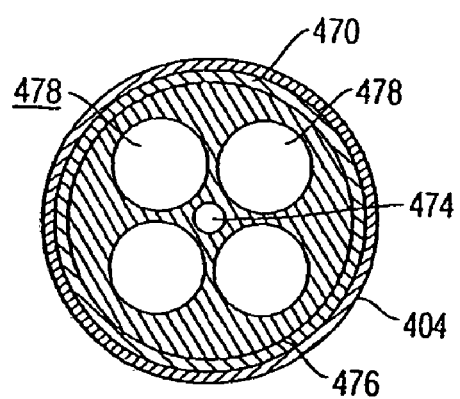
FIG. 3B is a cross-sectional view from line 3B-3B through the magnetron sputtering apparatus in FIG. 3.
Figure 3D:
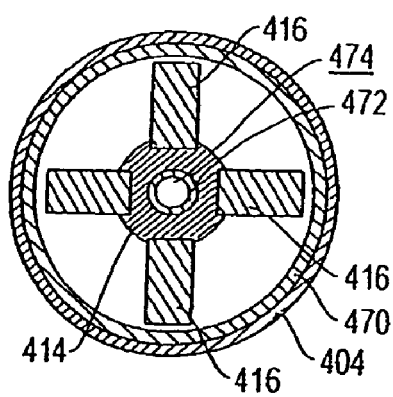
FIG. 3D is a lateral cross-sectional view from line 3D-3D through the magnetron sputtering apparatus in FIG. 3.

Referring to FIG. 3C, a rotor 480 is situated inwardly of each distributor plate 476. Preferably, the rotor 480 is mounted about the inner tube 472 and just forward of the magnet assembly 412, and such that rotor blades 480a of the rotor 480 are positioned in the coolant passage. The rotor blades 480a interact, therefore, with coolant passing through the coolant passage. Specifically, the moving coolant imparts fluid momentum upon the rotor blades 480a, thereby rotating the rotor 480. The rotor 480, which is fixedly connected with the rest of the support structure 414, rotates around the inner tube 472. In this way, the magnet assembly 412 is rotated relative to the sputter target material 404.

In further variations, the rotor 480 may be mounted on a bearing mounted on the inner tube 472. In this design, the rotor 480 is rotatable independent of the inner tube 472. Instead, the rotor 480 may be fixed directly to the rest of the support structure 414 or to the magnet assembly 412. In further configurations, the rotor blades 480a may be connected with the sputter target material 404 or the outer support tube 470. In these further configurations, rotation of the rotor 480 effects rotation of the sputter target material 404 relative to the magnet assembly 412.

The rotatable drive mechanism is energized by momentum of the flowing coolant in the cooling system (rather than an electrical source such as an external motor). Preferably, the coolant is pumped by an external pump or pressure differential (e.g., liquid head).

Coolant enters the magnetron 402 through a coolant inlet 486 and passes through the first distributor plate 476 (see arrows in FIG. 3), and then past the rotor 480. From the ports 478, the coolant passes through the magnet assembly 412 by way of channels between the rows of magnets 416, thereby convectively cooling the magnets 416. Coolant also passes by the outer support tube 470 and through the circumferential gaps 482. By convectively cooling the outer support tube 470, the coolant also cools the sputter target material 404. The second distributor plate 476 at the second end provides an outlet of the coolant and directs the hot coolant into the central conduit 474. The hot coolant returns through the central conduit 474 and out through an outlet 488 at the first end of the magnet. The hot coolant may be re-circulated by way of a suitable heat exchange system.

Figure 4:
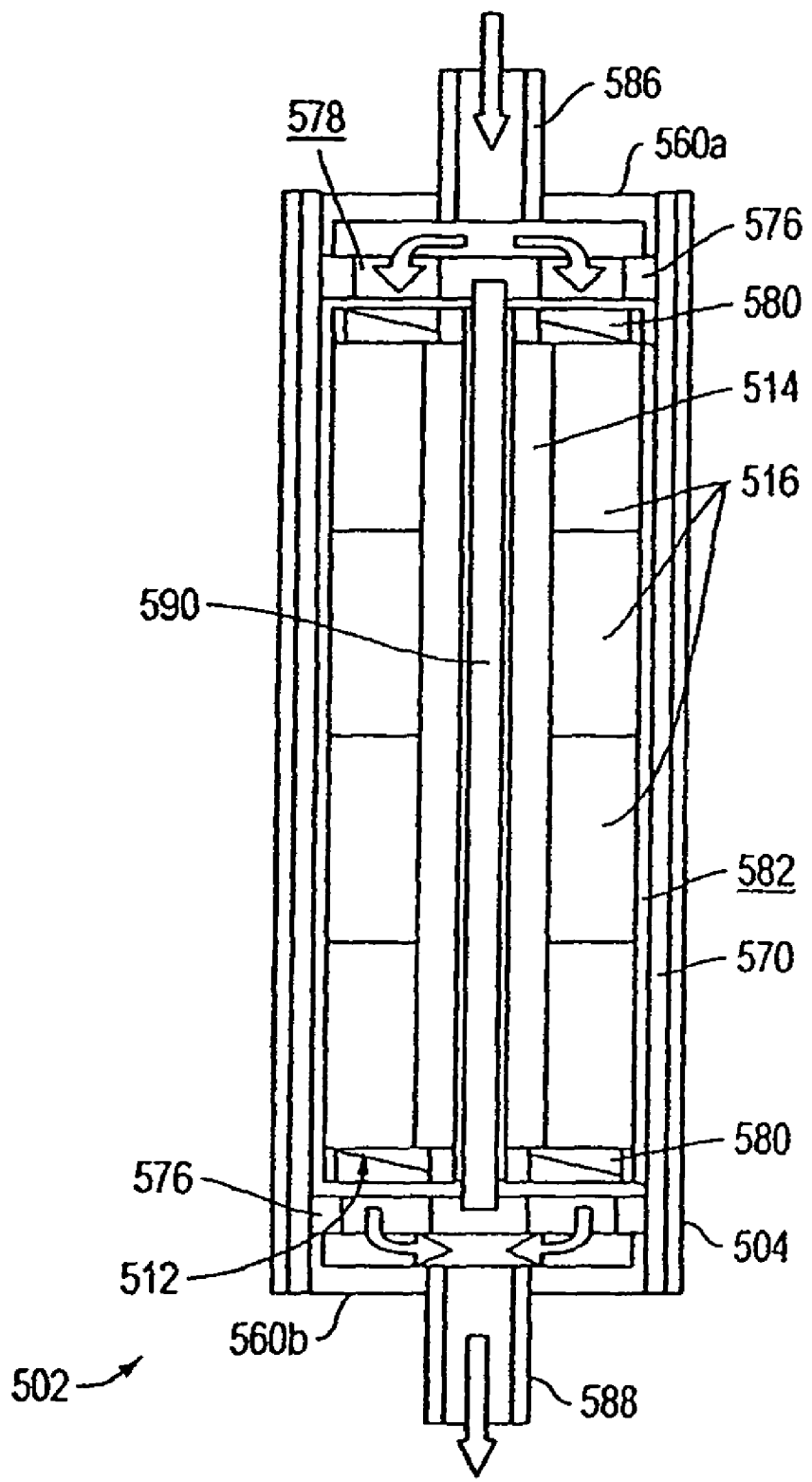
FIG. 4 is a simplified, longitudinal, cross-sectional view of another alternative magnetron sputtering apparatus, according to the present application.

FIG. 4 provides a variation of the magnetron 402 of FIG. 3. A magnetron 502 according to this design employs a magnet assembly 512 that is arranged similarly to that of the magnetron 402 in FIG. 3 and generates a magnetic field having the same characteristics. The magnetron 502 also includes a cylindrical sputter target material 504 disposed about an outer support tube 570. The outer support tube 570 is spaced radially outward of the magnet assembly 512 to form a circumferential gap 582 therebetween. In contrast to the magnetron 402 of FIG. 3, the support structure 514 does not include an inner tube 472; the magnetron 502 includes, instead, an inner shaft 590 about which the rest of the support structure 514 is mounted. As with the magnetron 402 of FIG. 3, the magnetron 502 is provided with end caps or plugs 560a, 560b, to enclose the interior and a coolant system therein. The magnetron 502 is provided, however, with a coolant inlet 586 on a first end and a coolant outlet 588 on the second, opposite end. The solid shaft 590 does not provide a coolant return conduit as with the magnetron 402 of FIG. 3, but does support rotor 580.

In this design, coolant enters through the inlet 586 and is directed along channels extending between the magnets 516 and through the circumferential gap 582. The hot coolant is discharged at the second end through the coolant outlet 588. As before, the passing coolant rotates the pair of rotors 580, thereby rotatably driving the support structure 514 and the magnet assembly 512 during the sputter deposition process.

Figure 5:
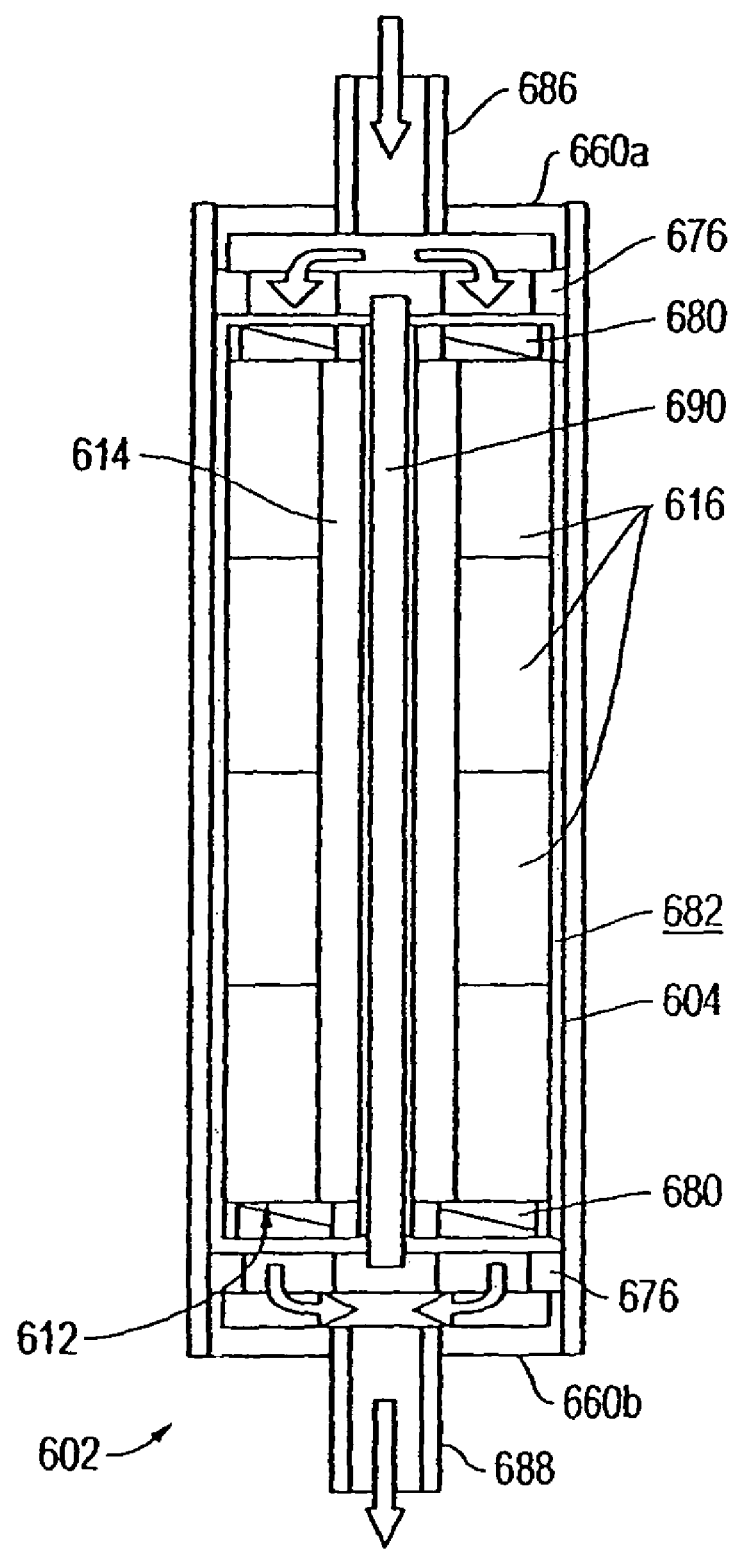
FIG. 5 is a simplified longitudinal cross-sectional view of yet another magnetron sputtering apparatus, according to the present application.

FIG. 5 illustrates, in simplified form, yet a further variation of the magnetrons depicted in FIGS. 1-4. Operation of this magnetron 602 effects direct cooling of the sputter target material 604, as well as the assembly 612 of magnets 616. As with the magnetron 502 of FIG. 4, the magnetron 602 of this design is provided with a coolant inlet 686 at one end and a coolant outlet 688 at a second, opposite end. The magnetron 602 does not, however, employ an outer tube (see e.g. outer tube 570) about which the sputter target material 604 is mounted. The sputter target material 604 is directly spaced across from the magnet assembly 612, thereby defining a circumferential gap 682 therebetween. End caps or plugs 660a, 660b are provided at the ends of the magnetron 602 to sealingly engage the cylindrical sputter target material 604, thereby enclosing the interior of the magnetron 602.

In the operation of the magnetron 602, coolant is directed through the inlet 686 and through the channels between the magnets 616 and the circumferential gap 682, thereby directly convectively cooling the magnets 616 as well as the sputter target material 604. The hot coolant is then discharged at the opposite end and through coolant outlet 688. Passing of the coolant through the cooling system also rotates rotors 680, thereby rotating the magnet assembly 612 relative to the sputter target material 604 during the deposition process.

An improved coating and method for applying same on surfaces such as rocket engine combustion chambers is described in co-pending U.S. patent application Ser. No. 11/054,665, entitled "Nanostructured Low-Cr Cu—Cr Coatings for High Temperature Oxidation Resistance." Therein is described a process for depositing a nano-structured coating on a workpiece using a vapor deposition process; specifically, electron beam physical vapor deposition (EBPVD) in combination with ion beam assisted deposition (IBAD) is utilized. By the present invention, a nano-structured Cr or Cu—Cr coating is applied using a magnetron sputtering deposition (MSD) process. As will be described in detail below, the use of a filament adapted to generate external plasma to enhance ion bombardment during deposition is complementary to the general MSD process described above.

The method of the present invention encompasses applying coatings containing nano-structured chromium (and optionally copper) particles having diameters of typically less than about 10 nm onto a workpiece. The workpiece comprises a copper containing surface and the coating is typically applied thereto to prevent or diminish the oxidation thereof, especially at elevated temperatures. Copper containing surface materials useful in practicing the present invention include, but are not limited to, alloys of Cu—Ag—Zr, Cu—Be, Cu—Co—B, Cu—Cr, Cu—Cr—Al, Cu—Cr—Nb, Cu—Cr—Zr—Mg, Cu—Nb, Cu—Ni, Cu—Ta, Cu—Zr, and Cu—Zr—Ti, oxygen-free high conductivity (OFHC) copper, and combinations thereof. Specific examples include NARloy-Z (Cu-3 wt. % Ag-0.5 wt. % Zr) and GRCop-84 (Cu-8 atom % Cr-4 atom % Nb).

In the following embodiments of the invention involving MSD, process and apparatus details are provided in view of the various embodiments disclosed above. References to device elements (such as magnets, magnet assemblies, energy and/or power sources, support structures (worktables), rotation devices, and the like) and process parameters therefor described below should be understood to incorporate the attributes thereof, and generally, only additional variations or modifications thereto will be described in detail.

Figure 6:
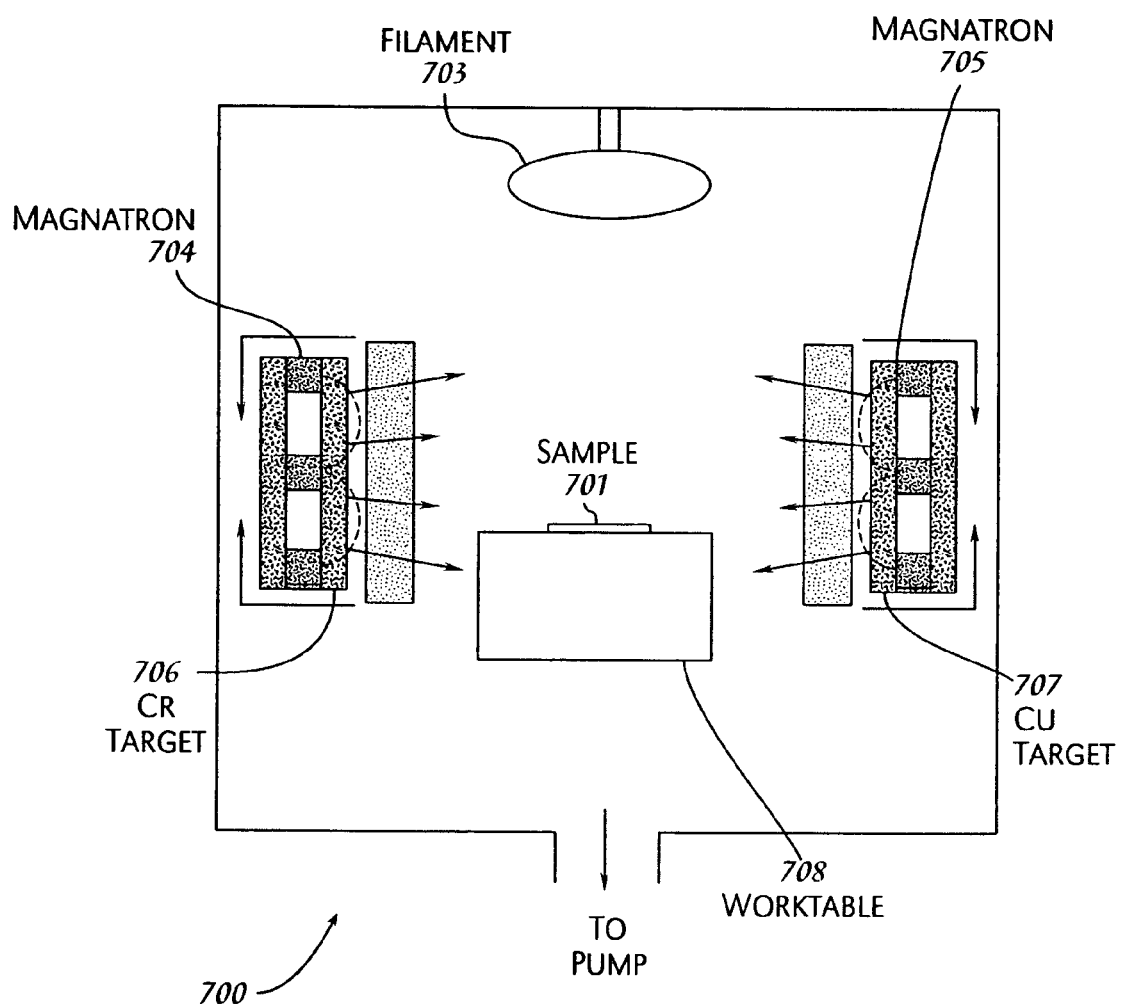
FIG. 6 is a schematic diagram of a planar plasma enhanced Cu—Cr co-sputter deposition system, according to the present application.

A planar MSD apparatus 700, depicted in FIG. 6, was utilized to deposit Cu, Cr, and composite Cu—Cr coatings onto a copper containing workpiece (sample) 701. As further shown in FIG. 6, MSD apparatus 700 comprises vacuum chamber 702, filament 703, magnetrons 704, 705, Cr target 706, Cu target 707, and worktable 708. The magnetrons 704, 705 are electronically connected to separate power supplies (not shown) and operate independently. Magnetron 704 is operatively associated with Cr target 706, while magnetron 705 is operatively associated with Cu target 707. Filament 703 is electronically connected to a power supply (not shown), while chamber 702 is operably associated with a vacuum pump (not shown) adapted to provide a reduced pressure environment within chamber 702. Worktable 708 is electronically connected to a power source (not shown) adapted to provide a bias voltage thereto. While FIG. 6 depicts an apparatus in a single configuration and containing a prescribed number of listed components, the present invention is not so limited and other embodiments comprising various configurations and numbers of components are contemplated hereby. For example, those skilled in the art would understand that additional components including, but not limited to, magnetrons, targets, worktables, and filaments, may be utilized in practicing the present invention.

In an embodiment of the present invention, the MSD apparatus 700 was utilized as follows. Samples comprising NARloy-Z (12.5 mm×15.2 mm×0.30 mm) and GRCop-84 (12.5 mm×15.2 mm×1.2 mm) were placed on worktable 708. Although FIG. 6 shows an orientation of sample(s) 701 perpendicular to the longitudinal axes of magnetrons 704, 705 (i.e., horizontal), samples 701 were also coated while disposed in an orientation parallel to the longitudinal axes of magnetrons 704, 705 (i.e., vertical). Other orientations of samples 701 may be employed in practicing the present invention. Magnetrons 704 and 705 were operatively associated with Cr target 706 comprising high-purity chromium (99.95% pure) and Cu target 707 comprising high-purity copper (99.997% pure) (both obtained from SCI Engineered Materials of Columbus, Ohio), respectively.

The surface of sample 701 was cleaned using a plasma ion cleaning step in which argon was introduced to the chamber 702 (via a gas introduction mechanism, not shown). The pressure within chamber 702 was reduced to about $10^{-5}$ torr using the vacuum pump (not shown) operably associated with chamber 702. With power lines (not shown) to magnetrons 704, 705 connected to ground, a bias of about 120 V DC power was supplied to sample 701 via a power line (not shown) to worktable 708. A discharge power supply (not shown) connected to filament 703 (via a power line, not shown) was activated and a discharge power of about 120 V DC was applied to filament 703, thereby producing a discharge current density of from about 0.1 mA/cm$^2$ to about 1.0 mA/cm$^2$. Thereby, an argon plasma was produced which bombarded the surface of sample 701, removing contaminants therefrom during the cleaning step having a duration of about 30 minutes. As would be generally understood by one skilled in the art, the optional cleaning process may be carried out using various operating conditions suitable for the specific sample(s) utilized and deposition process employed. Variables usefully altered to optimize a sputter cleaning step, include, but are not limited to, bias voltage, discharge voltage, gas employed, and cleaning time.

After the surface of sample 701 was cleaned, a coating was deposited thereon. With the pressure in chamber 702 maintained between about 0.1 millitorr and about 50 millitorr, and preferably between about 1 millitorr and about 20 millitorr, argon was introduced to chamber 702 while power was applied to magnetron 704 and/or power was applied to magnetron 705 to sputter material from targets 706 and/or 707, respectively, singularly, sequentially, or simultaneously onto sample 701. In a series of trials, the power to magnetrons 704, 705 was varied to produce coatings containing pure Cu, pure Cr, Cu-50Cr (i.e., 50 wt. % Cu and 50 wt. % Cr), Cu-25Cr, Cu-20Cr, and Cu-15Cr. In addition, some trials encompassed supplying power to filament 703 during the deposition process. Thereby, filament 703 generated an external plasma to enhance ion bombardment during deposition. This type of process is known as plasma enhanced magnetron sputter deposition (PEMSD). For trials incorporating plasma enhancement, power of from about 20 V to about 50 V was supplied to filament 703. To produce a Cu-50Cr coating, 4 kW of power was applied to magnetron 704 and 2 kW of power was applied to magnetron 705 for a period of about 1 hour to provide a coating having a thickness of about 8.6 μm. For a Cu-25Cr coating, 2 kW of power was applied to magnetron 704 and 1.3 kW of power was applied to magnetron 705 for a period of about 3 hours to provide a coating having a thickness of about 20 μm. The Cu-20Cr coating was deposited by applying 2 kW of power to magnetron 704 and 1 kW of power to magnetron 705 for a period of about 1 hour to provide a coating having a thickness of about 7 μm. Although argon was employed in the example described above, the present invention is not so limited and other gases, including but not limited to, krypton, xenon, combinations thereof, and combinations thereof with argon, may be employed. In addition, one skilled in the art would understand that other process parameters, including but not limited to, magnetron power and deposition times, may be varied within the scope of the present invention.

Figure 7A:
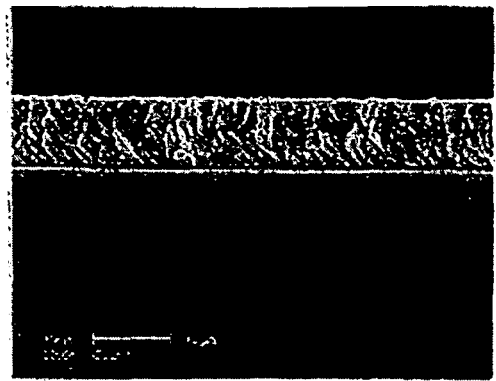
FIG. 7A is an SEM cross-sectional image of a composite Cu-50Cr coating deposited by an embodiment of the present invention.
Figure 7B:
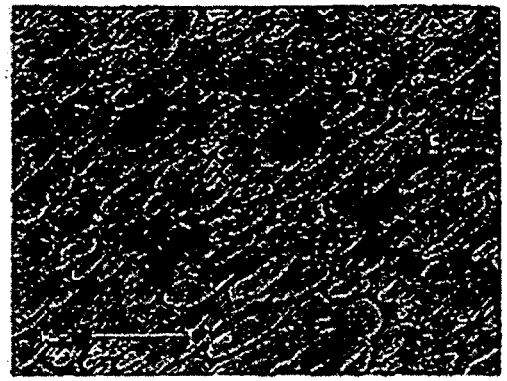
FIG. 7B is a scanning electron microscopy surface image of a composite Cu-50Cr coating deposited by an embodiment of the present invention.
Figure 7C:
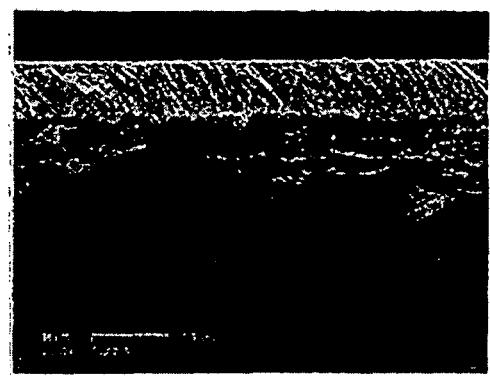
FIG. 7C is a scanning electron microscopy cross-sectional image of a composite Cu-25Cr coating deposited by an embodiment of the present invention.
Figure 7D:
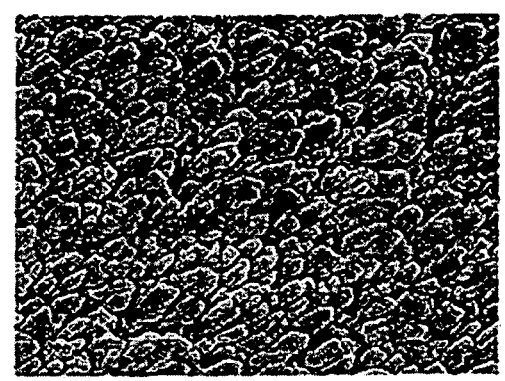
FIG. 7D is a scanning electron microscopy surface image of a composite Cu-25Cr coating deposited by an embodiment of the present invention.
Figure 7E:
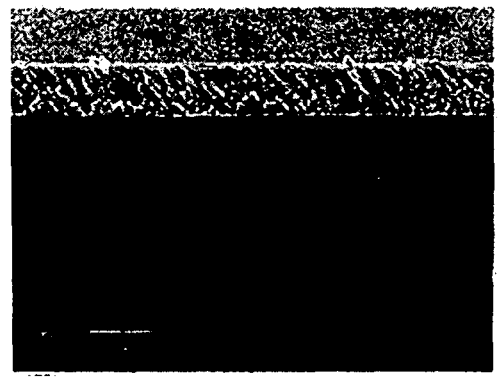
FIG. 7E is a scanning electron microscopy cross-sectional image of a composite Cu-20Cr coating deposited by an embodiment of the present invention.
Figure 7F:
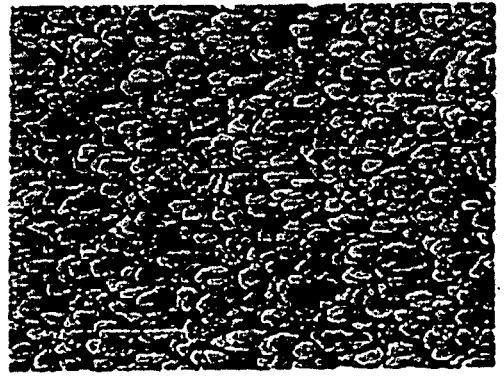
FIG. 7F is a scanning electron microscopy surface image of a composite Cu-20Cr coating deposited by an embodiment of the present invention.

Coatings so deposited onto samples 701 were analyzed for microstructure and morphology. FIGS. 7A-F show scanning electron microscope (SEM) images of various coatings deposited onto samples 701 using plasma enhancement (discharge voltage of about 120 V producing discharge current of about 5.0 A). FIGS. 7A and 7B show an SEM cross-sectional image and an SEM surface image, respectively, of a Cu-50Cr coating. FIGS. 7C and 7D show an SEM cross-sectional image and an SEM surface image, respectively, of a Cu-25Cr coating. FIGS. 7E and 7F show an SEM cross-sectional image and an SEM surface image, respectively, of a Cu-20Cr coating. The images in FIGS. 7A, 7C, and 7E reveal that the coatings exhibit a columnar growth microstructure. All coating surfaces shown in FIG. 7 have a platelet or rod-like microstructure, and the length of the rod structure appears to increase as the Cr content decreases. In addition, it was found that the microstructure of the coating was highly dependent on the distance between the magnetron(s) and the sample (sample orientation), and upon the extent of external plasma ion bombardment.

Figure 8:
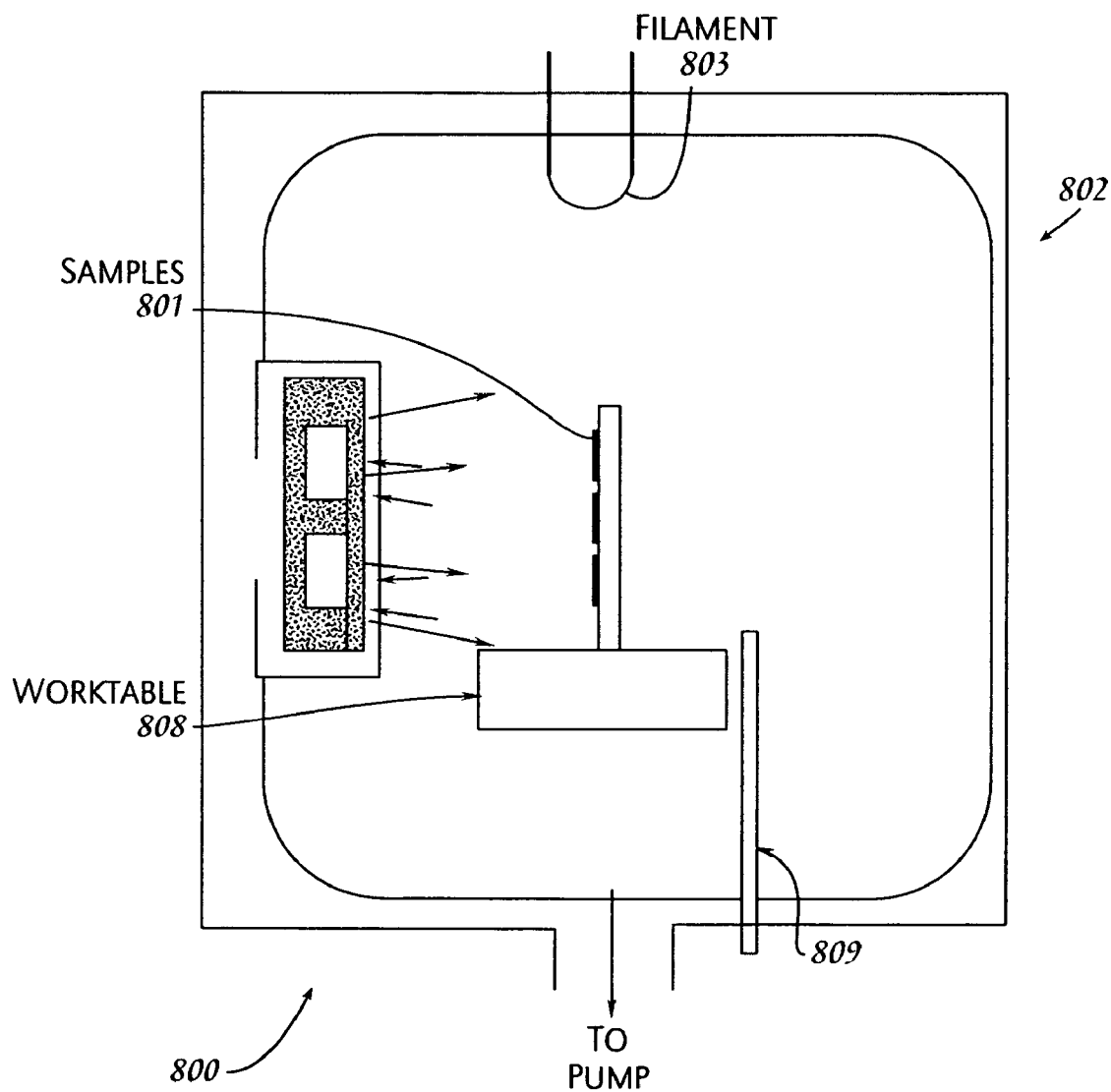
FIG. 8 is a schematic diagram of a another planar magnetron sputter deposition system, according to the present application.

To qualitatively determine the effects of sample orientation and ion bombardment, a planar MSD system 800, as described FIG. 8, was utilized to deposit a Cr coating onto flat workpieces (samples) comprising NARloy-Z and GRCop-84. As a preliminary step, the surfaces of the samples 801 (oriented horizontally and vertically on worktable 808) were cleaned using a plasma ion cleaning step. In the cleaning step, argon was fed to the chamber 802 via conduit 809. The pressure within chamber 802 was reduced to about $10^{-5}$ torr using a vacuum pump (not shown) operably associated with chamber 802. With a power line (not shown) to magnetron 804 connected to ground, a bias of about 120 V DC power was supplied to samples 801 via a power line (not shown) to worktable 808. A discharge power supply (not shown) connected to filament 803 (via a power line, not shown) was activated and a discharge power of 120 V DC was applied to filament 803. Thereby, an argon plasma was produced which bombarded the surface of samples 801, removing contaminants therefrom during the cleaning step having a duration of about 67 minutes.

For deposition of Cr onto the surfaces of samples 801, the pressure within chamber 802 was reduced to about $10^{-5}$ torr using the vacuum pump (not shown) operably associated with chamber 802. The bias voltage supplied to the samples 801 was reduced to about 40 V. With argon gas still being supplied to chamber 802, power (about 500 W) was applied to magnetron 804, associated with Cr target 806, with a discharge voltage of about 120 V being applied to filament 803. The total deposition time was about 5 hours. Experimental details regarding various trials of the above described process are listed in Tables 1 and 2 below.

TABLE 1

| Trial | Clean Time (min.) | Clean Bias (V) | Deposit Time (hr.) | Magnetron Power (W) | Discharge Voltage (V) | Discharge Current (A) | Sample Bias (V) | Bias Current (A) | Current Density (mA/cm$^2$) | Deposit Temp. (° C.) |
|---|---|---|---|---|---|---|---|---|---|---|
| 1 | 30 | 120 | 2 | 4000 | 120 | 5 | 40 | 0.11 | 1.9 | ~330 |
| 2 | 65 | 120 | 3 | 500 | 120 | 9 | 40 | 0.19 | 3.3 | ~370 |
| 3 | 55 | 120 | 3 | 500 | 0 | 0 | 40 | 0.01 | 0.2 | 200–270 |
| 4 | 45 | 120 | 3 | 500 | 120 | 6 | 40 | 0.15 | 2.6 | ~320 |
| 5 | 50 | 120 | 3 | 500 | 0 | 0 | 40 | 0.02 | 0.3 | 201 |
| 6 | 40 | 120 | 2 | 500 | 120 | 20 | 40 | 0.35 | 6.0 | ~450 |
| 7 | 40 | 120 | 3 | 500 | 120 | 10 | 40 | 0.18 | 3.1 | ~390 |
| 8 | 60 | 120 | 5 | 500 | 0 | 0 | 40 | 0.02 | 0.2 | ~250 |
| 9 | 60 | 120 | 5 | 500 | 120 | 5 | 40 | 0.22 | 1.9 | ~345 |
| 10 | 67 | 120 | 5 | 500 | 120 | 10 | 40 | 0.37 | 3.2 | ~400 |
| 11 | 60 | 120 | 5 | 500 | 120 | 19 | 40 | 0.57 | 4.9 | ~485 |

TABLE 2

| Trial | Coating Thickness (μm) | Ion-To-Atom Ratio |
|---|---|---|
| 8 | 10.1 | 0.23:1 |
| 9 | 7.7 | 3.33:1 |
| 10 | 8 | 5.38:1 |
| 11 | 7.4 | 8.97:1 |

Regarding the data contained in Table 1, the Clean Bias represents the voltage applied to the samples 801 (via worktable 808) during the cleaning step; the Magnetron Power represents the voltage applied to the magnetron 804 during the deposition process; the Discharge Voltage represents the voltage applied between the filament and the vacuum chamber; the Discharge Current represents ion current generated; the Sample Bias represents the voltage applied to the samples 801 (via worktable 808) during the deposition step; and the Current Density represents the current arrived at the sample surface per unit area. In Table 2, Ion-To-Atom Ratio represents the ratio of the number of ions arriving at the surface to the number of atoms deposited.

Figure 9A:
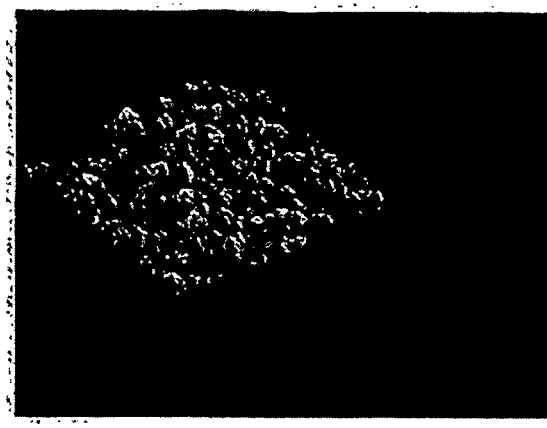
FIG. 9A is an atomic force microscopy image of a Cr coating deposited on a sample disposed in a horizontal orientation without plasma enhancement.
Figure 9B:
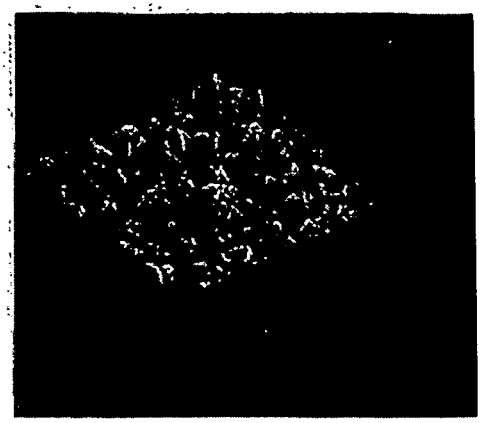
FIG. 9B is an atomic force microscopy image of a Cr coating deposited on a sample disposed in a vertical orientation without plasma enhancement.
Figure 9C:
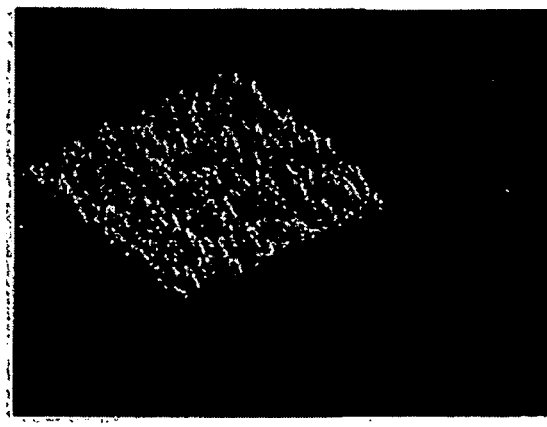
FIG. 9C is an atomic force microscopy image of a Cr coating deposited on a sample disposed in a horizontal orientation utilizing plasma enhancement.
Figure 9D:
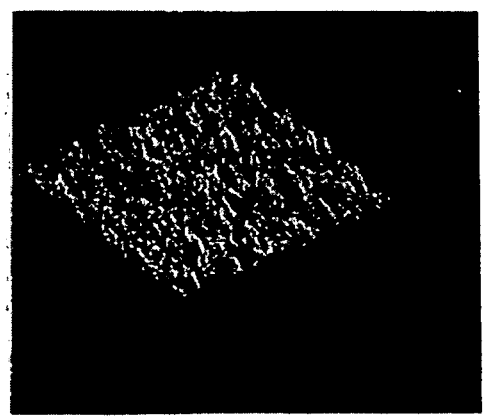
FIG. 9D is an atomic force microscopy image of a Cr coating deposited on a sample disposed in a vertical orientation utilizing plasma enhancement.

The use of multiple samples 801, oriented horizontally and vertically on worktable 808, allowed for a direct determination of the effect sample geometry has on coating topology and morphology. The employment of a plasma enhanced ion bombardment during the deposition process (trials 1-2, 4, 6-7, & 9-11) was useful in elucidating the effect thereof on coating microstructure. FIGS. 9A and 9B are atomic force microscopy (AFM) images of coatings produced by trial 8 deposited in a horizontal orientation and vertical orientation, respectively, of samples 801. FIGS. 9C and 9D are AFM images of coatings produced by trial 9 deposited with a horizontal orientation and vertical orientation, respectively, of samples 801. As seen by FIGS. 9A and 9B, the absence of ion bombardment results in the deposition of a coating exhibiting numerous peaks and valleys indicating that film growth was not uniform. The peak-to-valley height range (Z range) shown in FIGS. 9A and 9B is about 2.0 µm (vertical scale=2.0 µm/division). As shown by FIGS. 9C and 9D, the Z range of the Cr coating deposited using plasma enhancement (ion bombardment) is only about 0.5 µm (vertical scale=0.5 µm/division). Thus, ion bombardment has a substantial (positive) effect on the Cr film surface topography.

Figure 10A:
FIG. 10A is a scanning electron microscopy image of a Cr coating deposited on a sample disposed in a horizontal orientation without plasma enhancement.
Figure 10B:
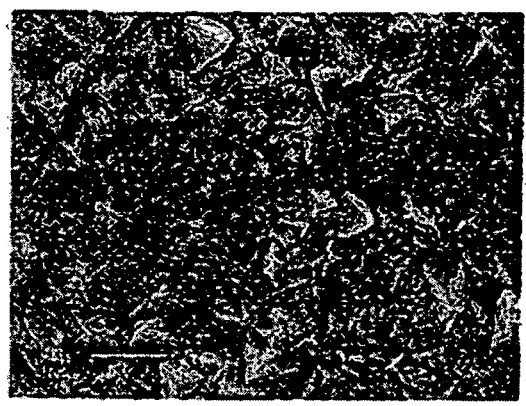
FIG. 10B is a scanning electron microscopy image of a Cr coating deposited on a sample disposed in a vertical orientation without plasma enhancement.
Figure 10C:
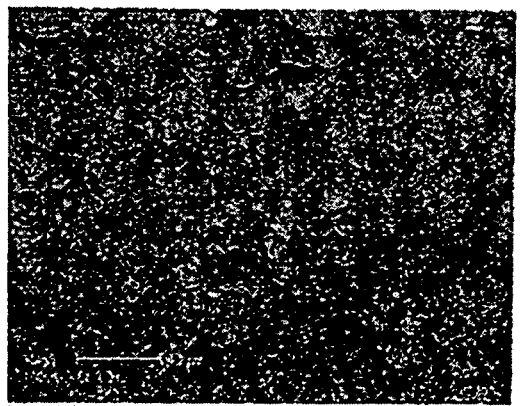
FIG. 10C is a scanning electron microscopy image of a Cr coating deposited on a sample disposed in a horizontal orientation utilizing plasma enhancement.
Figure 10D:
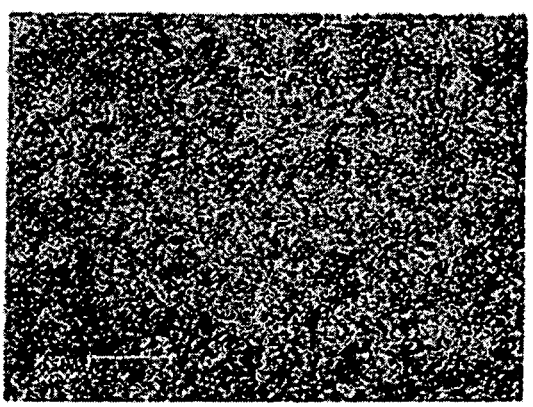
FIG. 10D is a scanning electron microscopy image of a Cr coating deposited on a sample disposed in a vertical orientation utilizing plasma enhancement.

FIGS. 10A-D show the effect of sample geometry and ion bombardment on Cr film surface morphology. FIGS. 10A and 10B are SEM images of coatings produced by trial 8 deposited with a horizontal orientation and vertical orientation, respectively, of samples 801. FIGS. 10C and 10D are SEM images of coatings produced by trial 9 deposited with a horizontal orientation and vertical orientation, respectively, of samples 801. As seen by FIG. 10A, horizontal orientation and the absence of ion bombardment results in the deposition of a coating manifesting a porous, columnar microstructure. FIG. 10C shows that horizontal orientation with ion bombardment results in the deposition of a coating exhibiting a low degree of porosity and some degree of columnar microstructure. Coatings deposited on samples oriented vertically (FIGS. 10B and 10D) are denser, with the most uniform and dense microstructure observed being shown in FIG. 10D, which was the result of vertical orientation and ion bombardment. FIGS. 10A-D therefore show that better film deposition occurs when the sample is vertically oriented, and support the finding above that ion bombardment improves film microstructure.

Figure 11A:
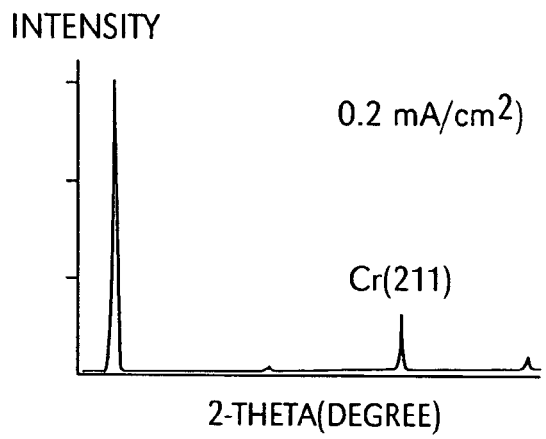
FIGS. 11A-D show X-ray diffraction patterns of Cr coatings deposited on samples disposed in a vertical orientation according to the present invention utilizing various levels of plasma enhancement.
Figure 11B:
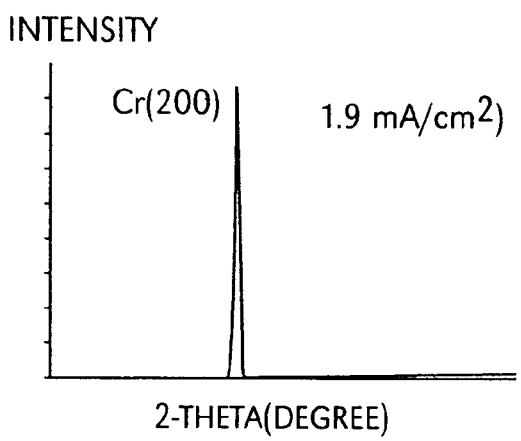
Figure 11C:
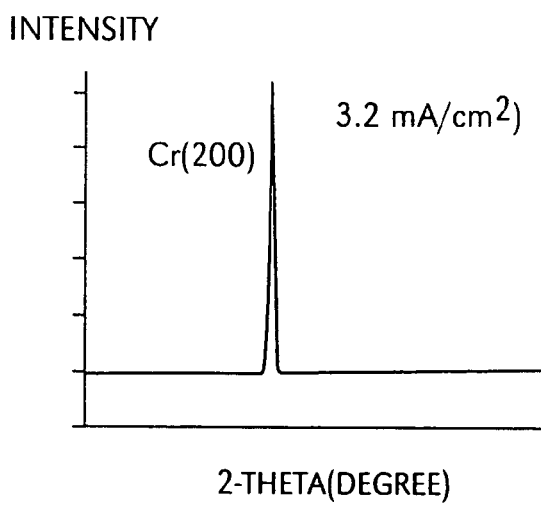
Figure 11D:
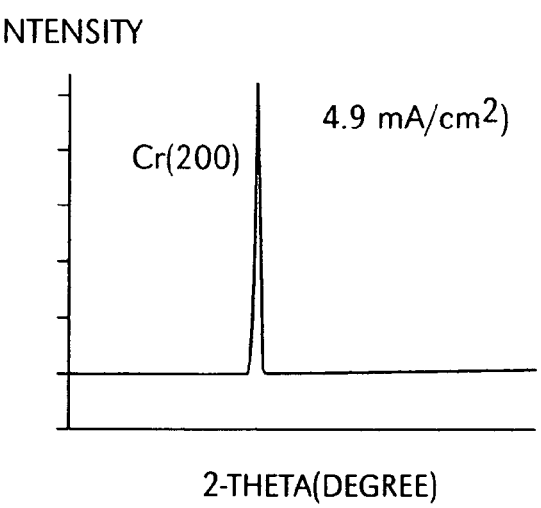

X-ray diffraction (XRD) analysis and cross-section SEM analysis were performed on specimens deposited with various degrees of ion bombardment. FIGS. 11A, 11B, 11C, and 11D, which depict coating data obtained from trials 8, 9, 10, & 11, respectively, show the results of the XRD analysis. The magnitude of the ion bombardment (quantified by the "Current Density" data described in Table 1) markedly affects the texture of the deposited Cr film. As shown in FIG. 11A, the XRD pattern for the film without ion bombardment (trial 8 in Table 1, current density=0.2 mA/cm$^2$) exhibits strong Cr(110) and Cr (211) peaks. In contrast, the XRD patterns in FIGS. 11B-D for Cr films with ion bombardment (trials 9-11, respectively, in Table 1) show predominantly Cr(200) diffraction peaks with negligible Cr(110) or Cr(211) diffraction peaks. Cross-sectional SEM micrographs, shown in FIGS. 12A-D, illustrate the effects of various degrees of ion bombardment on Cr film microstructure. Without ion bombardment, the deposited film exhibits a columnar structure (FIG. 12A, trial 8 in Table 1, 0.2 mA/cm$^2$ current density). As current density is increased to 1.9 mA/cm$^2$ (FIG. 12B, trial 9 in Table 1), the deposited film is denser, but still exhibits some degree of columnar structure. Current density of 3.2 mA/cm$^2$ (FIG. 12C, trial 10 in Table 1) produced a dense, noncolumnar structure. Further increase of current density to 4.9 mA/cm$^2$ (FIG. 12D, trial 11 in Table 1) generated additional stress in the deposited film without further change in coating texture (see FIG. 11D), coating thickness or coating microstructure (FIGS. 12C and 12D). In summary, the trial 10 sample deposition parameters (current density 3.2 mA/cm$^2$) produced a dense, noncolumnar film microstructure. Thus, these process parameters were selected for further testing of Cr film deposition. One skilled in the art, however, would understand that variations in apparatuses, targets, surfaces to be coated, and the like, would necessitate optimization of deposition parameters.

Figure 13A:
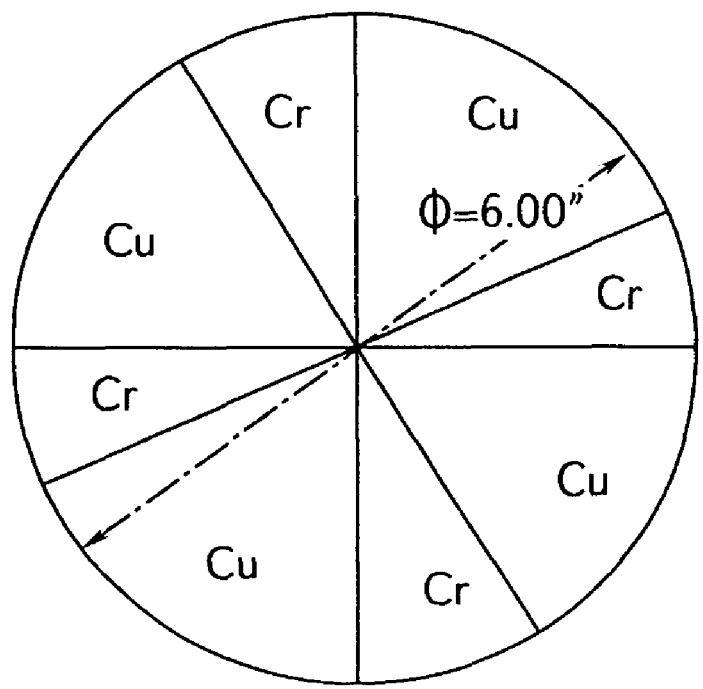
FIG. 13A shows a diagram of a composite Cu—Cr target for magnetron sputter deposition, according to the present invention.
Figure 13B:
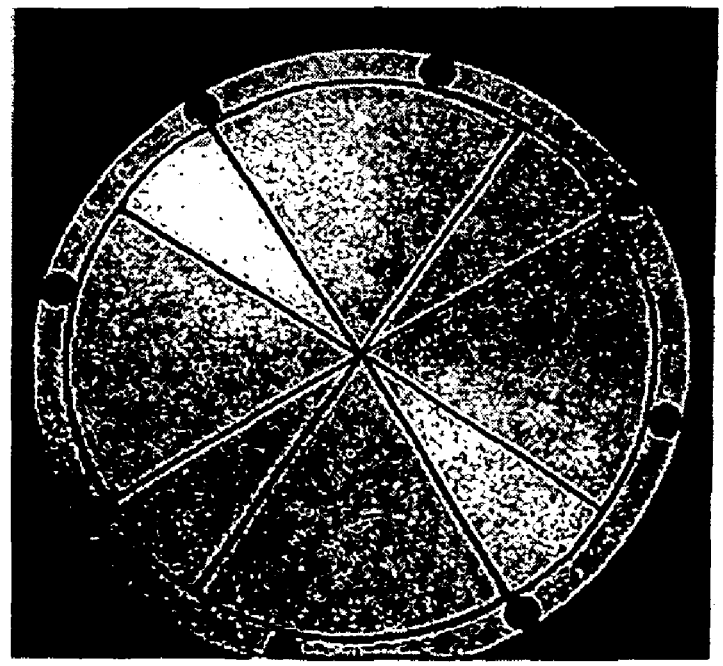
FIG. 13B shows a photograph of a fabricated composite Cu—Cr target for magnetron sputter deposition, according to the present invention.

To test the applicability of the optimized reaction conditions for concurrent deposition of Cu and Cr, a composite Cu—Cr target was designed and fabricated. The Cu—Cr target consisted of four 90° sections, with each section comprising a 65° pie-shaped segment of Cu and a 25° pie-shape segment of Cr. (See FIG. 13A). The Cu and Cr segments were bonded into a copper backing plate by brazing. The composite target was fabricated by Plamaterials, Inc., of Livermore, Calif. A photograph of the completed Cu—Cr composite target is shown in FIG. 13B. Composite Cu—Cr targets containing different relative amounts of Cu and Cr and/or produced by other means may be employed with the present invention. Such means include, but are not limited to, making a slot in a Cu target and inserting a Cr rod therein, drilling an array of holes in a Cu target and inserting Cr pellets therein, and using a hot isostatic press to prepare a Cu—Cr target from a mixture of Cu and Cr powder. To produce the Cu and Cr containing coating, the composite Cu—Cr target was disposed within the MSD apparatus shown in FIG. 8, and the sputtering process was carried out utilizing the reaction conditions described above exemplified by trial 10 of Table 1, thereby depositing a composite Cu—Cr coating (~Cu-15.5Cr) on NARloy-Z and GRCop-84 alloy samples.

Figure 14A:
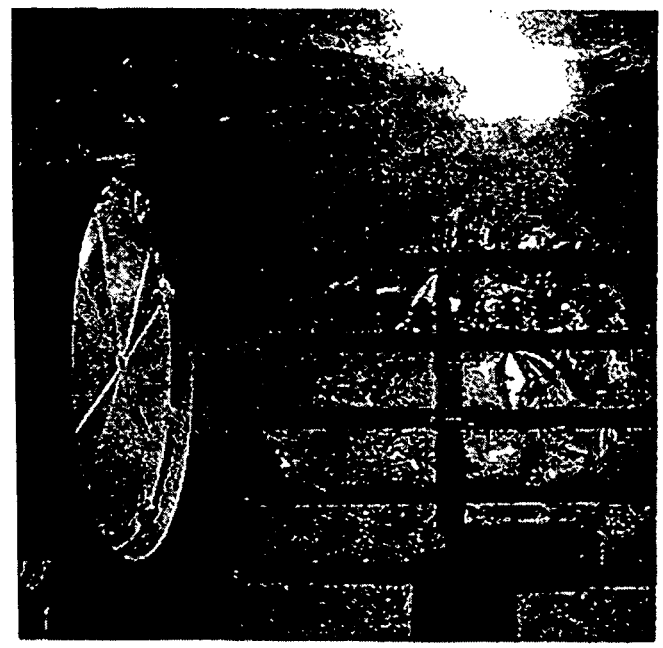
FIG. 14A shows a photograph of the plasma enhanced magnetron sputter co-deposition of Cu and Cr using a composite Cu—Cr target, according to the present invention.
Figure 14B:
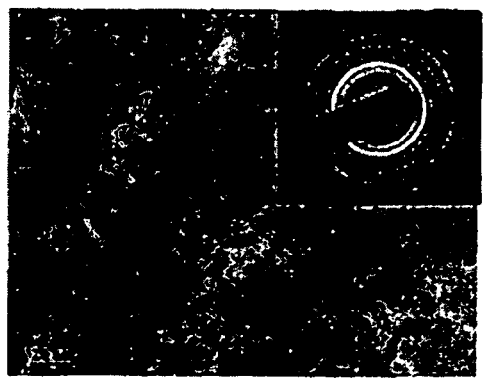
FIG. 14B shows a planar view transmission electron micrograph and selected area diffraction pattern of the coating deposited during the process depicted in FIG. 14A.
Figure 14C:
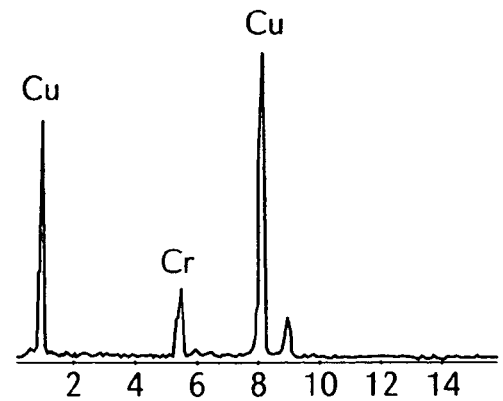
FIG. 14C shows an energy dispersive x-ray analysis of the coating deposited during the process depicted in FIG. 14A.

A photograph of a magnetron sputter co-deposition of Cu and Cr using the composite Cu—Cr target is shown in FIG. 14A. A planar view transmission electron micrograph (TEM) and selected area diffraction pattern (FIG. 14B) of the coating reveal that the coating consists of a very fine mixture of Cu and Cr phases. The particle sizes are approximately 5-30 nm. Energy dispersive x-ray analysis (EDX) confirmed that the coating contains only the elements of Cu and Cr (FIG. 14C).

Figure 15A:
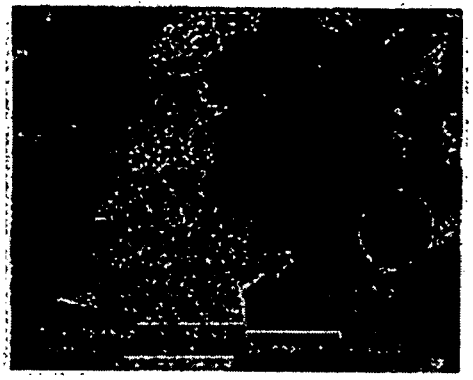
FIGS. 15A-E show scanning electron microscopy images of uncoated and magnetron sputter co-deposited Cu—Cr coated specimens after cyclic oxidation tests.
Figure 15B:
Figure 15C:
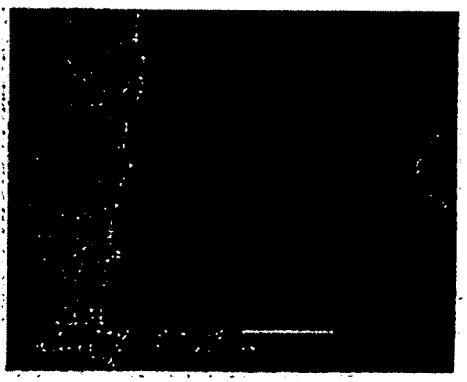
Figure 15D:
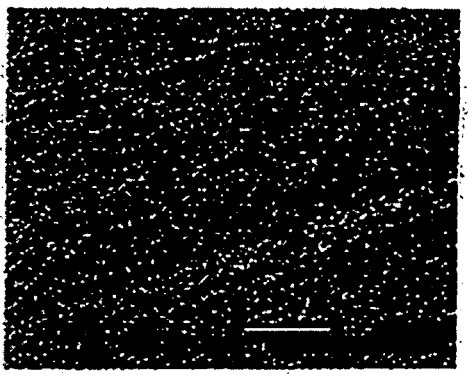
Figure 15E:
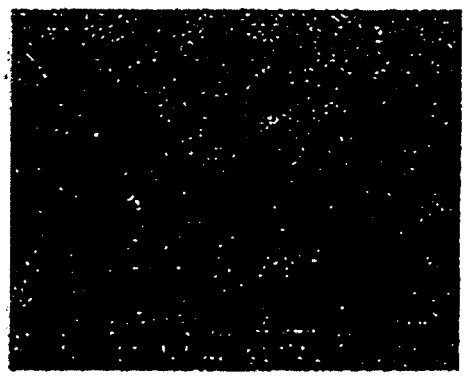

Cyclic oxidation tests were performed to evaluate the oxidation resistance of the planar magnetron sputter deposited Cu—Cr coatings. Each oxidation test cycle consisted of rapidly heating to 650° C., maintenance thereat for 30 minutes, followed by rapid cooling. The total time of each heating and cooling cycle was about 1 hour. FIGS. 15A-E show SEM micrographs of uncoated and magnetron sputter co-deposited Cu—Cr coated specimens after cyclic oxidation tests to 650° C. FIGS. 15A and 15B show the appearance of the uncoated copper alloy after ten 650° C. cycles. The uncoated specimen formed thick, external Cu-oxide scale. The Cu-oxide scale was not protective and spalled severely during cooling to room temperature. In contrast, the magnetron sputter deposited Cu-15.5Cr coating exhibited an adherent coating, with no coating cracking or spallation even after 20 cycles to 650° C. (FIGS. 15C and 15D). EDX analysis of the magnetron sputter deposited coating surface showed that the surface oxide is enriched in Cr, indicating that a protective Cr-rich oxide is formed. FIG. 15E shows a surface SEM micrograph of a magnetron sputter deposited Cr coating produced by PEMSD with a planar magnetron, after twenty 650° C. cycles. The coated surface showed no coating cracking or spallation, further indicating that a protective chromia ($Cr_2O_3$) scale was formed.

In an embodiment of the present invention, a rotational cylindrical MSD system with liquid-cooling capability was utilized to deposit a composite Cu—Cr coating on a tubular workpiece. Although the embodiment described below uses water as the cooling liquid, any suitable liquid having the required heat capacity may be employed. The workpiece, depicted in FIG. 16A, comprises oxygen-free high conductivity Cu (OFHC Cu) and represents a scaled-down version of a rocket engine combustion chamber. The subscale liner is approximately ⅙ scale of a Space Shuttle Main Engine combustion chamber liner. The thickness of the subscale Cu liner is about 1 mm. The diameter at the forward end of the subscale liner (depicted in FIG. 16A as the open end) is about 117 mm, and the diameter at the other end is 145 mm. The diameter at the throat (narrowest) region is approximately 90 mm. Other workpieces comprising Cu alloys including, but not limited to, those described herein and combinations thereof may be employed in this embodiment. In addition, tubular workpieces comprising different geometries, dimensions, and/or thicknesses may be utilized.

Figure 16A:
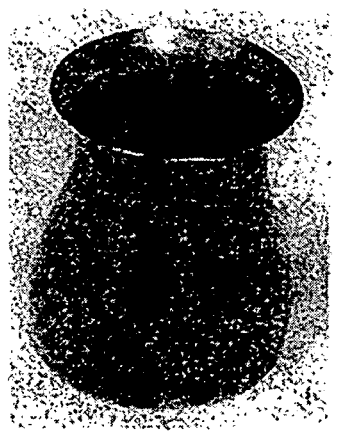
FIG. 16A shows a scaled-down version of a rocket engine combustion chamber comprising oxygen-free high conductivity Cu.
Figure 16B:
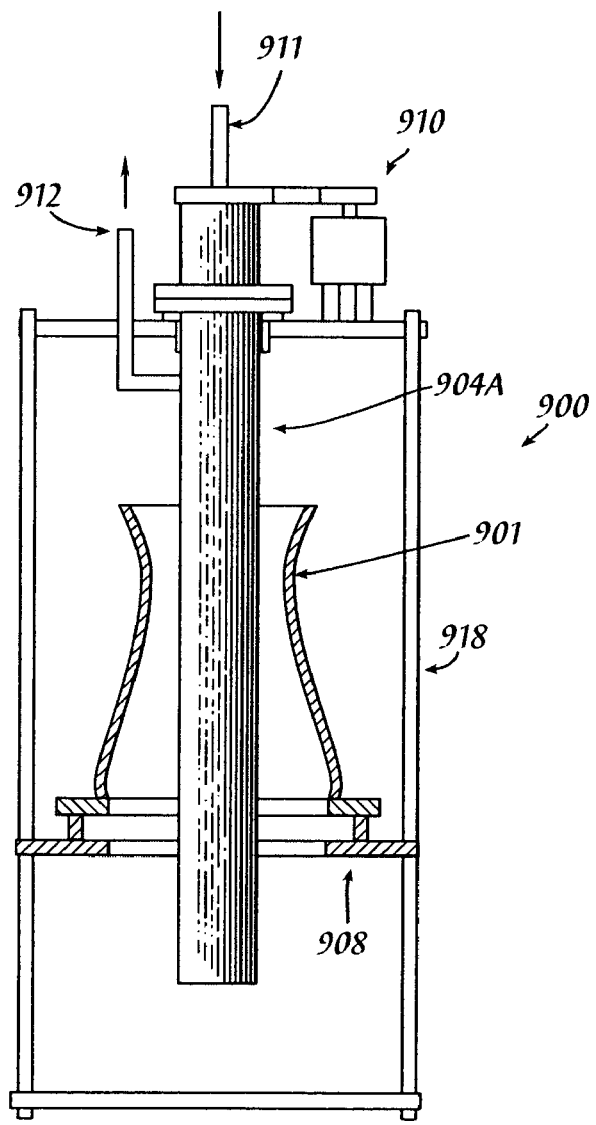
FIG. 16B shows a schematic diagram of a rotational cylindrical magnetron sputtering deposition system, according to the present invention.
Figure 17:
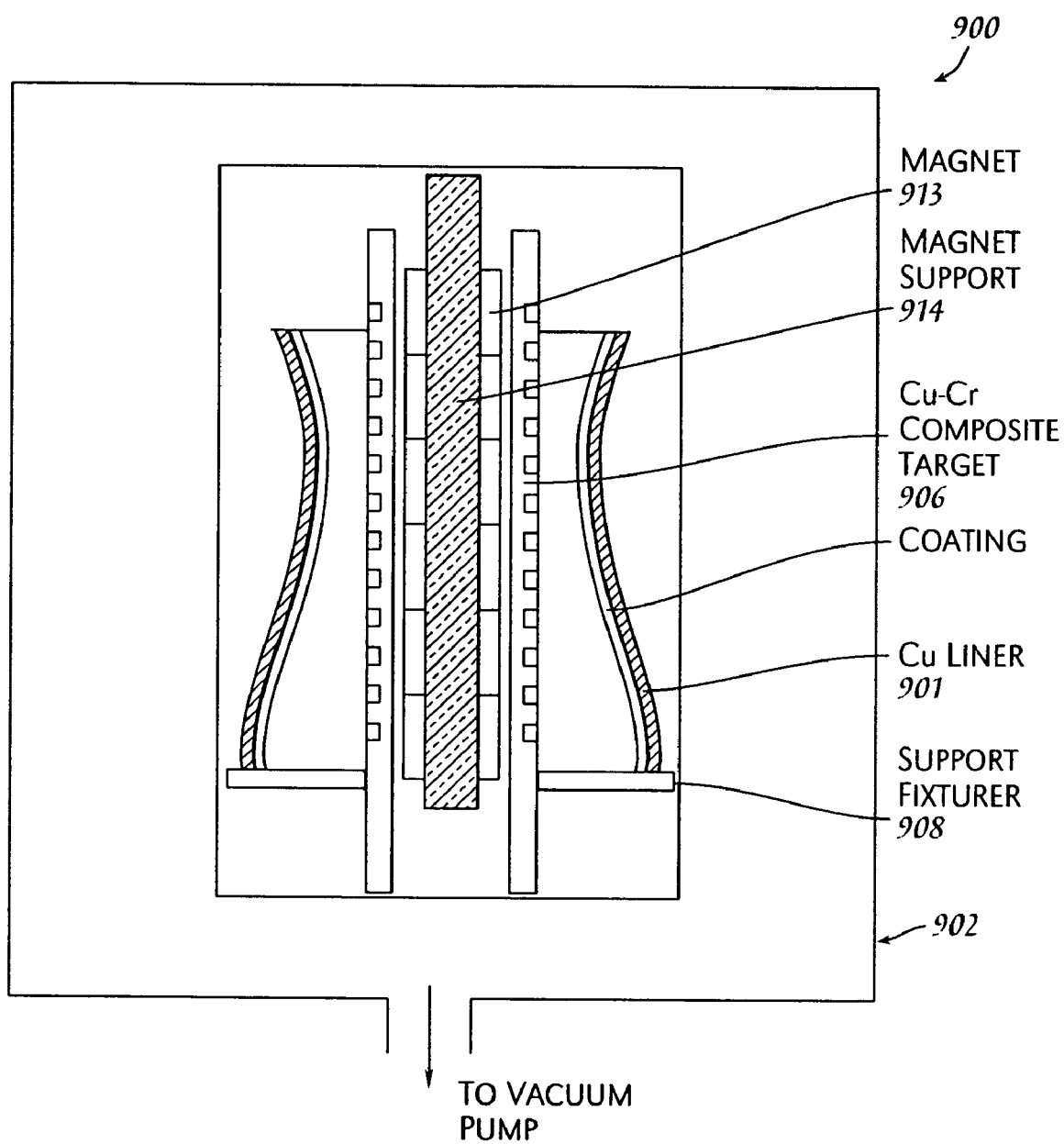
FIG. 17 shows another schematic diagram of the rotational cylindrical magnetron sputtering deposition system depicted in FIG. 16B.

FIG. 16B shows a schematic diagram of the system 900, including workpiece (liner) 901 (and a coating deposited thereon), holding fixture 918, magnetron assembly 904A, worktable 908, rotation system 910, water inlet 911, and water outlet 912. Holding fixture 918 was also designed and fabricated for the subscale liner 901. FIG. 17 schematically shows further details of MSD system 900, including composite Cu—Cr target 906, magnets 913, and magnet support 914. To produce a uniform coating on the inside wall of the workpiece, composite Cu—Cr target 906, and optionally other components of magnetron assembly 904A, can be designed to conform to the shape of workpiece 901. Thereby, the distance between the target 906 and the surface to be coated will be the same along the length thereof.

Figure 18A:
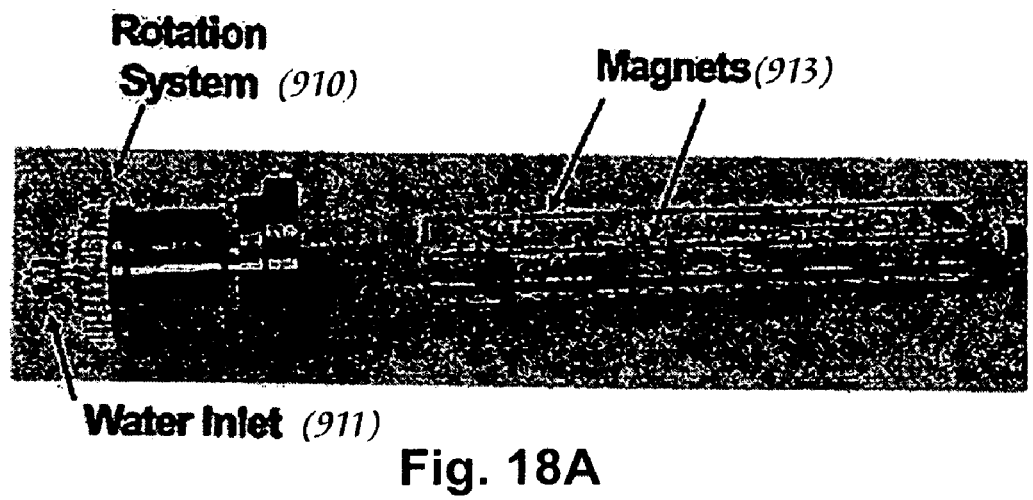
FIGS. 18A-C show various components of a magnetron assembly contained within the rotational cylindrical magnetron sputtering deposition system depicted in FIG. 16B.
Figure 18B:
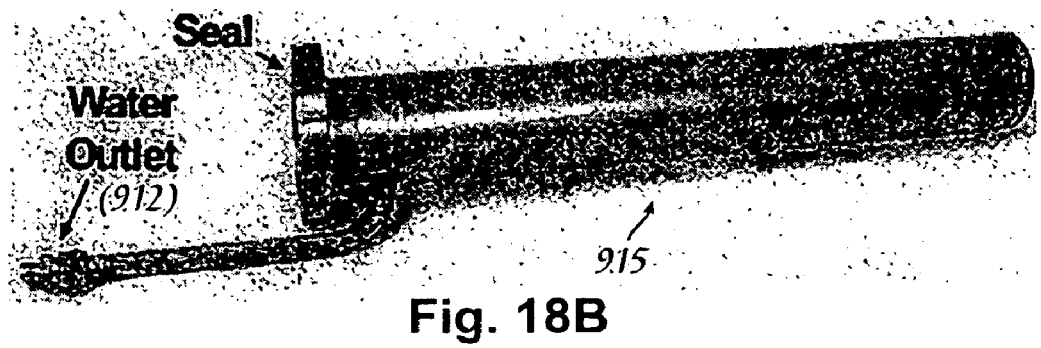
Figure 18C:
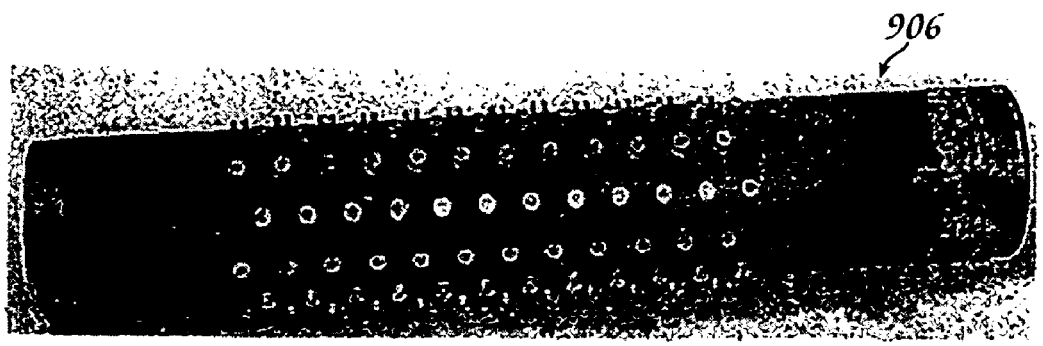
Figure 19:
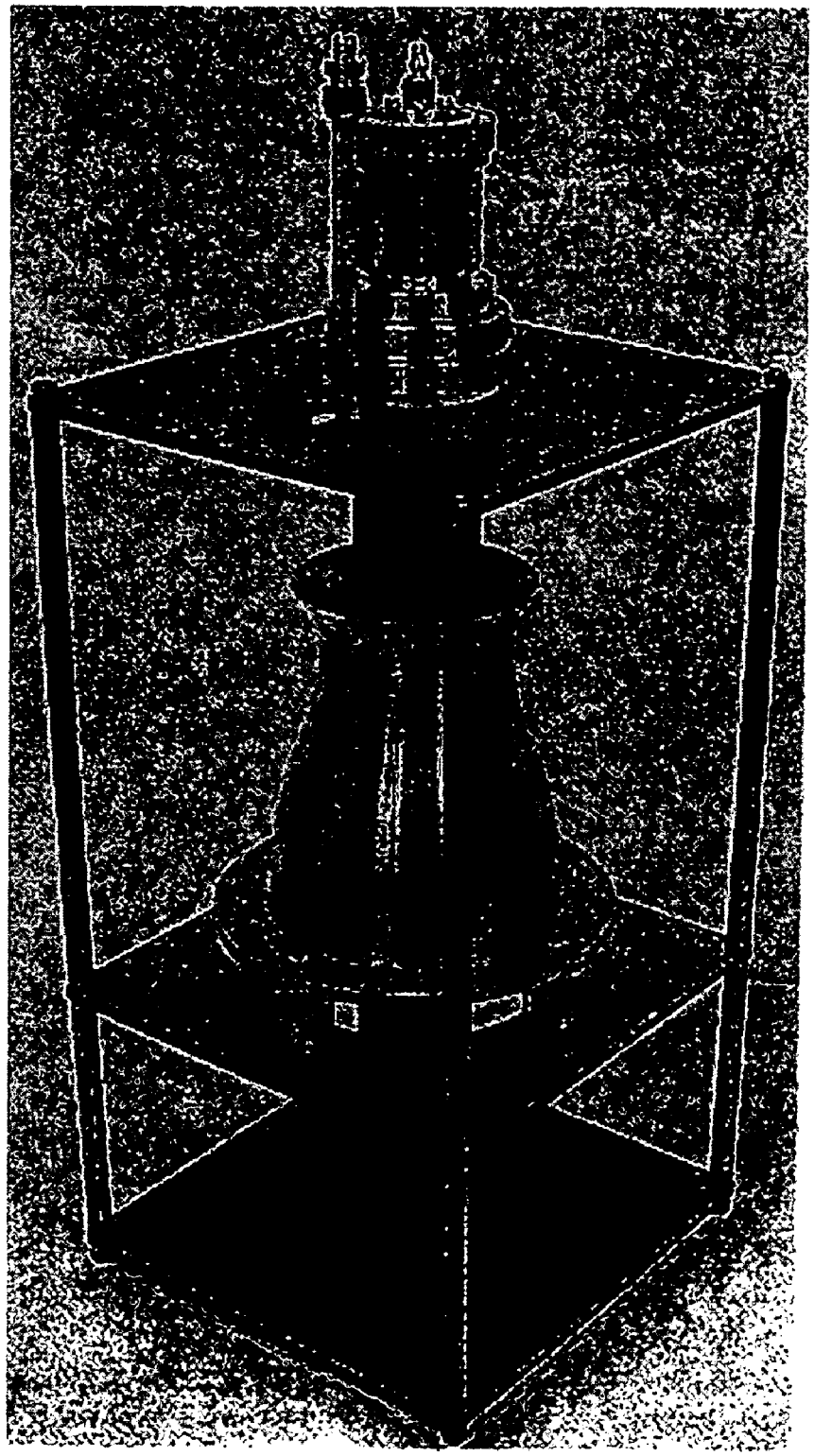
FIG. 19 shows a photograph of the apparatus of the rotational cylindrical magnetron sputtering deposition system depicted in FIG. 16B.

FIGS. 18A-C illustrate the major components of the magnetron assembly 904A of rotational MSD system 900. FIG. 18A shows three sets of magnets 913 aligned around the axis of rotation, and rotation mechanism 910 with cooling water inlet 911. FIG. 18B shows cooling water jacket 915 and water outlet 912. FIG. 18C shows a cylindrical Cu—Cr composite target 906 produced from a pure Cu tube with Cr inserts. Other magnet configurations, cooling components, or rotation mechanisms may also be utilized in practicing the present invention. The completed apparatus of the cylindrical MSD system 900 for the deposition of a Cu—Cr coating on the inside wall of the subscale liner is shown in FIG. 19.

Figure 20:
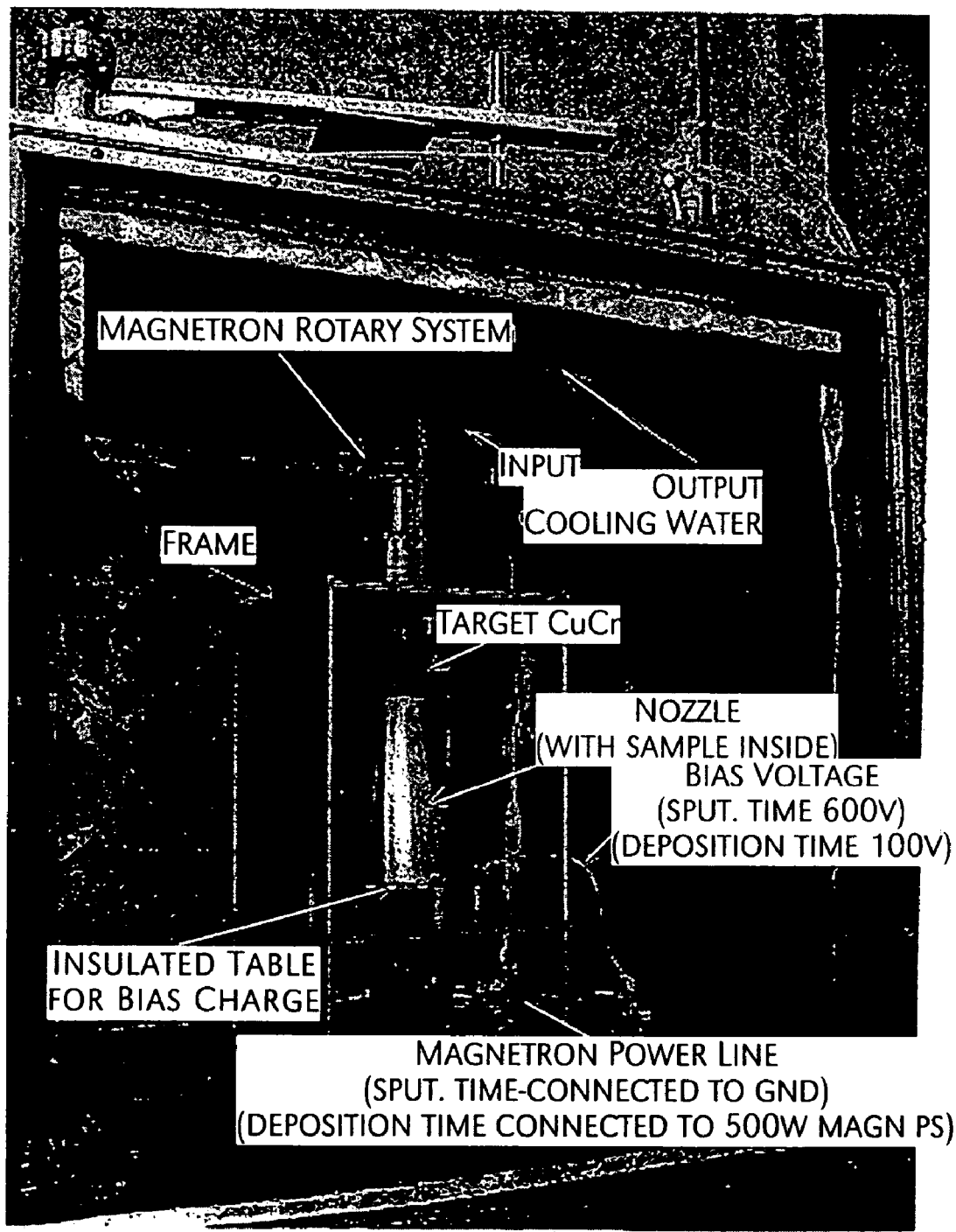
FIG. 20 shows a photograph of an experimental setup employing the rotational cylindrical magnetron sputtering deposition system depicted in FIG. 16B.
Figure 21:
FIGS. 21A-B show views of a subscale liner coated with Cu—Cr utilizing the rotational cylindrical magnetron sputtering deposition system depicted in FIG. 16B.

A photograph of the experimental setup employing MSD system 900 for depositing a composite Cu—Cr coating on the inside wall of the subscale liner 901 is shown in FIG. 20. The entire apparatus was placed inside the deposition vacuum chamber 902. Cooling water lines (inlet 911 and outlet 912) were connected through the top of the vacuum chamber 902. Electric connections to magnetron power line 916 and bias voltage power line 917 are shown in FIG. 20. After the vacuum chamber 902 was pumped down to about $5 \times 10^{-5}$ torr (using a vacuum pump (not shown) operatively associated with chamber 902, a sputter cleaning of the liner 901 surface was initiated using a bias voltage of 600V for 15 minutes. During the sputter cleaning process, the magnetron power line 916 was connected to ground. After the sputter, cleaning process, the magnetron power line 916 was connected to a 500-watt magnetron power supply (not shown) and bias voltage was reduced to 100V. The pressure within vacuum chamber 902 was raised to and maintained at about 5 millitorr. The liner 901 was rotated using rotation mechanism 910 at a speed of about 10 rpm. Cooling water was circulated through cooling water jacket 915 (not visible) via water inlet 911 and water outlet 912 at a rate of about 2 gpm. The temperature of the process was measured to be about 150° C. The total deposition time was about 5 hours. Although a deposition time of 5 hours was utilized in this embodiment, one skilled in the art would understand that the deposition time may be varied depending on variables including, but not limited to, target material, bias voltage, discharge voltage, rotation speed, liner composition, and desired coating properties. While this embodiment employed a deposition chamber pressure of about 5 millitorr, the pressure in vacuum chamber during the sputtering process may range from about 0.1 millitorr to about 20 millitorr, preferably from about 1 millitorr to about 5 millitorr.

During the deposition process, Cu and Cr particles from the cylindrical Cu—Cr composite target 906 were simultaneously sputter-deposited on the inside wall of the liner 901. Witness test specimens (not shown) were mounted on a vertical strip adjacent to the Cu liner 901 so that the coating thickness and composition could be evaluated. The coating thickness was determined to be approximately 8 μm. EDX analysis of the witness specimens mounted on the inside wall of liner 901 confirmed that both Cu and Cr elements were present. FIG. 21A shows the bottom view of the Cu—Cr coated subscale liner 901, while FIG. 21B shows the top view thereof. The discolored stripe in FIG. 21A (indicated by arrow) indicates the locations of witness specimens during the deposition process. Surprisingly, surface analysis of the Cu—Cr coating deposited on liner 901 shows that the microstructure thereof does not comprise the columnar and rod-like particles observed previously for MSD coatings deposited without ion bombardment (plasma enhancement). Not to be bound by theory, it is believed that the positive effects on surface uniformity that result from (1) rotation of the target relative to the liner, and (2) more uniform distribution of the Cr target material within the Cu target material result in a denser, more uniform coating deposition.

The composite Cu—Cr coating has the composition range of between about 5 wt. % Cr to about 30 wt. % Cr, preferably between about 8 wt. % Cr and about 12 wt. % Cr as a layer adjacent to the Cu-alloy substrate. Multiple composite Cu—Cr coating layers may be sequentially deposited, or a series of coating layers containing Cu—Cr and/or Cr may be sequentially deposited. The deposited coating can have a composite Cu—Cr top layer containing a higher Cr content (from between about 30 wt. % Cr to about 95 wt. % Cr), or a Cr top layer. Layer thickness may range from about 5 μm to about 100 μm, preferably from about 12 μm to about 30 μm. Composite thickness of all layers may range from about 5 μm to about 200 μm, preferably from about 10 μm to about 40 μm. Diameters of the Cu and/or Cr particles deposited range from about 5 nm to about 100 nm. In addition, the Cu—Cr composite coating may comprise additional materials, including but not limited to, elemental yttrium and cerium. In an embodiment of the present invention, composite Cu—Cr coatings comprising from about 0.1 wt. % yttrium to about 2 wt. % yttrium were produced. It was found that the presence of yttrium in the coating results in better adherence of the protective oxide scale. Coatings containing from about 0.1 wt. % cerium to about 2 wt. % cerium may be produced. The target can be produced with incorporation of the additional materials such as yttrium or cerium therein as described above for Cr.

In another embodiment, cylindrical MSD system 900 may comprise a filament (not shown) with which plasma enhancement of the deposition process may be accomplished. As disclosed for the planar MSD process described above with reference to FIG. 8, a discharge power supply (not shown) connected to the filament would be activated during the deposition process to effect additional ion bombardment of the inside wall of the subscale liner 901. In one embodiment, the discharge voltage may range from about 50 V to about 150 V.

Persons of ordinary skill in the relevant chemical, mechanical, and other relevant arts will recognize that further modifications and variations may be made to the structures, methods, and assemblies described in respect to FIGS. 1-21, without departing from the spirit and scope of the present application. Processes and structures previously described are meant to be illustrative only and should not be taken as limiting the application, which is defined by the claims below. The Figures have also been described and illustrated so as to explain the best modes for practicing the system, apparatus, and method according to the application.

We claim:

1. A method for depositing a nanostructured metal coating on an interior surface of a hollowed copper-containing workpiece comprising:
   providing said hollowed copper-containing workpiece comprising an interior surface to be coated and a cylindrical bore having a longitudinal axis;
   providing a sputter target material comprising one or more metals having a longitudinal bore substantially coextensive with said longitudinal axis;
   positioning said workpiece, said sputter target material, and a magnet assembly in a vacuum chamber, whereby said sputter target material is disposed substantially within said workpiece and said magnet assembly is disposed substantially within said sputter target material;
   providing to said vacuum chamber a gas suitable for forming plasma;
   reducing the pressure of said vacuum chamber;
   rotating said magnet assembly relative to said sputter target material; and
   generating a circumferentially directed magnetic field with said magnet assembly proximate said sputter target material, thereby ionizing said gas to produce plasma thereof, whereby bombardment of said sputter target material by said plasma causes particles of said sputter target material to be directed toward and deposited on said interior surface, thereby forming a nanostructured coating comprising particles of copper and chromium, wherein said coating includes 1) chromium present in the range of between about 5 wt % to about 30 wt % in a layer adjacent to the workpiece; 2) multiple layers comprising copper and chromium sequentially deposited or a series of layers comprising copper and chromium and/or chromium sequentially deposited; and 3) a top layer comprising chromium present from between about 30 wt % to about 95 wt %.

2. The method of claim 1, wherein said sputter target material comprises yttrium and said yttrium is present in amount of from about 0.1 weight percent to about 2 weight percent.

3. The method of claim 1, wherein said workpiece is a combustion chamber liner.

4. The method of claim 1, wherein said nanostructured coating has a thickness ranging from about 5 μm to about 200 μm.

5. The method of claim 1, wherein substantially all of said particles of said one or more metals deposited on said interior surface have a diameter ranging from about 5 nm to about 100 nm.

6. The method of claim 1, wherein said nanostructured coating comprises chromium in a concentration of from about 5 weight percent to about 30 weight percent.

7. The method of claim 1, wherein said method further comprises utilizing a filament to ionize said gas to produce plasma thereof.

8. The method of claim 7, wherein the utilizing said filament comprises supplying a discharge voltage of from about 50 V to about 150 V thereto.

9. The method of claim 1, wherein said method further comprises additional steps comprising:
   removing said sputter target material from said vacuum chamber;
   introducing a second sputter target material comprising one or more metals to said vacuum chamber; and
   depositing said second sputter target material on top of said nanostructured coating to form a second nanostructured coating comprising particles of said one or more metals of said second sputter target material thereover.

10. The method of claim 9, wherein said sputter target material consists essentially of substantially pure copper and substantially pure chromium.

11. The method of claim 9, wherein said second sputter target material consists essentially of chromium.

12. The method of claim 9, wherein said second nanostructured coating comprises chromium in a concentration of from about 5 weight percent to about 30 weight percent.

13. The method of claim 9, wherein the composite thickness of all said nanostructured coatings ranges from about 5 μm to about 100 μm.

14. The method of claim 1, wherein said workpiece comprises a material selected from the group consisting of NARloy-Z, GRCop-84, and oxygen-free high conductivity copper.

15. The method of claim 1, wherein said workpiece comprises a copper alloy selected from the group consisting of Cu—Ag—Zr, Cu—Be, Cu—Co—B, Cu—Cr, Cu—Cr—Al, Cu—Cr—Nb, Cu—Cr—Zr—Mg, Cu—Nb, Cu—Ni, Cu—Ta, Cu—Zr, Cu—Zr—Ti, and combinations thereof.

16. The method of claim 1, wherein said workpiece is tubular and comprises different geometries, dimensions and/or thicknesses and said magnet assembly is configured to conform to the shape of said workpiece, thereby providing a substantially constant distance therebetween along the lengths thereof.

17. The method of claim 1, wherein the pressure in said vacuum chamber is maintained from about 0.1 millitorr to about 20 millitorr.

18. The method of claim 1, wherein said nanostructure coating further comprises one or more elements selected from the group consisting of yttrium and cerium.

19. The method of claim 1, wherein copper is present in said nanostructure coating at a level of at least 85 wt %.

20. A method for depositing a nanostructured metal coating on a surface of a copper-containing workpiece comprising:
   providing said copper-containing workpiece comprising a surface to be coated;
   providing one or more sputter target materials each comprising one or more metals;
   positioning said workpiece, said one or more sputter target materials, a filament, and one or more magnet assemblies in a vacuum chamber, whereby each one of said one or more sputter target materials are disposed proximate said workpiece and one of said one or more magnet assemblies is disposed proximate each one of said one or more sputter target materials;

providing to said vacuum chamber a gas suitable for forming plasma;

reducing the pressure of said vacuum chamber;

generating a magnetic field with at least one of said one or more magnet assemblies, thereby ionizing said gas to produce plasma thereof; and generating a discharge current from said filament, thereby ionizing said gas to produce additional plasma thereof, whereby bombardment of at least one of said sputter target materials by said plasma produced by said one or more magnet assemblies and said additional plasma produced by said filament causes particles of said one or more sputter target materials to be directed toward and deposited on said surface, thereby forming a nanostructured coating comprising copper and chromium, wherein said coating includes 1) chromium present in the range of between about 5 wt % to about 30 wt % in a layer adjacent to the workpiece; 2) multiple layers comprising copper and chromium sequentially deposited or a series of layers comprising copper and chromium and/or chromium sequentially deposited; and 3) a top layer comprising chromium present from between about 30 wt % to about 95 wt %.

21. The method of claim 20, wherein at least one of said one or more sputter target materials consists essentially of substantially pure copper and substantially pure chromium.

22. The method of claim 20, wherein at least one of said one or more sputter target materials consists essentially of substantially pure chromium.

23. The method of claim 20, wherein said at least one of said one or more sputter target materials comprises yttrium and said yttrium is present in amount of from about 0.1 weight percent to about 2 weight percent.

24. The method of claim 20, wherein at least one of said one or more sputter target materials comprises one or more materials selected from the group consisting of yttrium and cerium.

25. The method of claim 20, wherein said nanostructured coating has a thickness ranging from about 5 μm to about 200 μm.

26. The method of claim 20, wherein substantially all of said particles of said one or more metals deposited on said surface have a diameter ranging from about 5 nm to about 100 nm.

27. The method of claim 20, wherein said nanostructured coating comprises chromium in a concentration of from about 5 weight percent to about 30 weight percent.

28. The method of claim 20, wherein said discharge current from said filament ranges from about 5 Amperes to about 25 Amperes.

29. The method of claim 20, wherein said discharge current from said filament is produced by supplying a discharge voltage of from about 50 V to about 150 V thereto.

30. The method of claim 20, wherein said workpiece comprises a material selected from the group consisting of NARloy-Z, GRCop-84, and oxygen-free high conductivity copper.

31. The method of claim 20, wherein said workpiece comprises a copper alloy selected from the group consisting of Cu—Ag—Zr, Cu—Be, Cu—Co—B, Cu—Cr, Cu—Cr—Al, Cu—Cr—Nb, Cu—Cr—Zr—Mg, Cu—Nb, Cu—Ni, Cu—Ta, Cu—Zr, Cu—Zr—Ti, and combinations thereof.

32. The method of claim 20, wherein the pressure in said vacuum chamber is maintained from about 0.1 millitorr to about 50 millitorr.

33. The method of claim 20, wherein said method comprises a plurality of discrete steps each comprising forming said nanostructured coating comprising said one or more metals on said surface, and wherein each said step comprises generating a magnetic field with at least one of said one or more magnet assemblies.

34. The method of claim 33, wherein at least one of said discrete steps comprises generating a magnetic field with a different combination of said one of said one or more magnet assemblies from another of said discrete steps.

35. The method of claim 20, wherein said nanostructure coating further comprises one or more elements selected from the group consisting of yttrium and cerium.

36. The method of claim 20, wherein copper is present in said nanostructure coating at a level of at least 85 wt %.

* * * * *